(12) United States Patent
Babhadiashar et al.

(10) Patent No.: US 11,576,286 B2
(45) Date of Patent: Feb. 7, 2023

(54) ANTI EMF RADIATION PROTECTIVE HOUSING

(71) Applicant: DENZ ENGINEERING GROUP, LLC, Los Gatos State, CA (US)

(72) Inventors: Navid Babhadiashar, Los Gatos, CA (US); Adam Teso, San Jose, CA (US); Linghao Gao, San Diego, CA (US)

(73) Assignee: Denz Engineering Group, LLC, Los Gatos, CA (US)

( * ) Notice: Subject to any disclaimer, the term of this patent is extended or adjusted under 35 U.S.C. 154(b) by 0 days.

(21) Appl. No.: 17/685,255

(22) Filed: Mar. 2, 2022

(65) Prior Publication Data

US 2022/0192062 A1 Jun. 16, 2022

Related U.S. Application Data

(63) Continuation-in-part of application No. 17/119,177, filed on Dec. 11, 2020, now abandoned, which is a continuation of application No. 16/726,030, filed on Dec. 23, 2019, now Pat. No. 10,869,414, which is a continuation of application No. 16/370,490, filed on Mar. 29, 2019, now Pat. No. 10,542,642.

(60) Provisional application No. 62/650,836, filed on Mar. 30, 2018.

(51) Int. Cl.
*H05K 9/00* (2006.01)
(52) U.S. Cl.
CPC .......... *H05K 9/0003* (2013.01); *H05K 9/009* (2013.01); *H05K 9/0073* (2013.01)

(58) Field of Classification Search
CPC .............................. H05K 9/0003; H05K 9/009
See application file for complete search history.

(56) References Cited

U.S. PATENT DOCUMENTS

| | | | |
|---|---|---|---|
| 2,881,778 | A | 4/1959 | Goldman |
| 3,390,491 | A | 7/1968 | Hayden et al. |
| 3,546,721 | A | 12/1970 | Cleary |
| 4,043,349 | A | 8/1977 | Gays et al. |
| 4,785,136 | A | 11/1988 | Mollet et al. |
| 4,790,340 | A | 12/1988 | Mahoney |
| D342,633 | S | 12/1993 | Shields-Mijares |
| 5,908,043 | A | 6/1999 | Paes et al. |
| 6,011,504 | A | 1/2000 | Tan |
| 6,140,576 | A | 10/2000 | Kanne et al. |
| 8,061,377 | B2 | 11/2011 | Vestergaard Frandsen |
| 8,530,756 | B1 | 9/2013 | Winch |
| 8,859,913 | B2 | 10/2014 | Judy |

(Continued)

FOREIGN PATENT DOCUMENTS

GB 2227931 8/1990

*Primary Examiner* — Hung V Ngo
(74) *Attorney, Agent, or Firm* — Lewis Roca Rothgerber Christie LLP

(57) ABSTRACT

A protective housing for shielding against electro-magnetic field (EMF) radiation includes a conductive mesh, a frame coupled to the conductive mesh and configured to define a shape of the conductive mesh, and a frame cover coupled to the frame and the conductive mesh, the frame cover including a main body coupled to the frame, a first swivel portion rotatably coupled to a first end of the main body, and a second swivel portion rotatably coupled to a second end of the main body, the first and second swivel portions corresponding to an entry of the protective housing.

19 Claims, 33 Drawing Sheets

(56) References Cited

U.S. PATENT DOCUMENTS

| | | |
|---|---|---|
| 8,872,042 B2 | 10/2014 | Cordes et al. |
| 9,029,714 B2 | 5/2015 | Winch et al. |
| 9,609,791 B2 | 3/2017 | Tam et al. |
| 9,820,583 B1 | 11/2017 | Gu |
| 2004/0006267 A1* | 1/2004 | Buchanan ............ G01R 33/025 600/409 |
| 2004/0158920 A1 | 8/2004 | Walling |
| 2008/0094695 A1 | 4/2008 | Simpson et al. |
| 2008/0304246 A1* | 12/2008 | Utschig ................. A61B 6/102 361/818 |
| 2009/0185265 A1 | 7/2009 | Myers |
| 2013/0254989 A1 | 10/2013 | Garcia et al. |
| 2014/0343642 A1* | 11/2014 | Lauer ................... H05K 9/0001 607/115 |

* cited by examiner

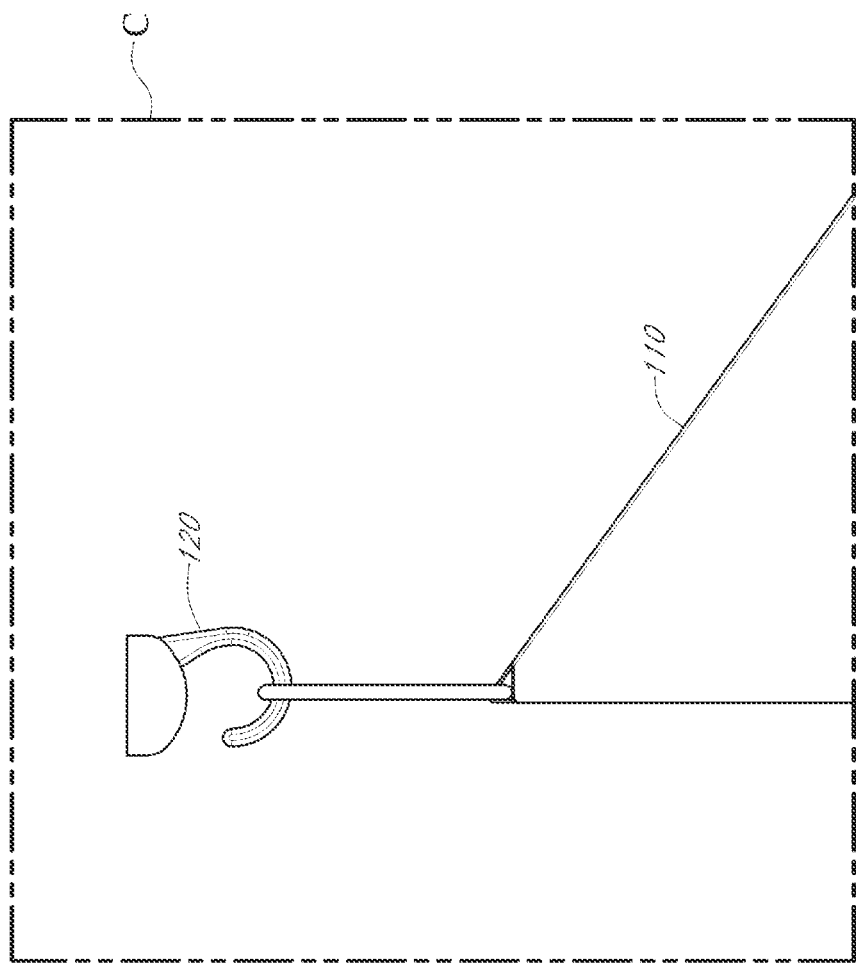

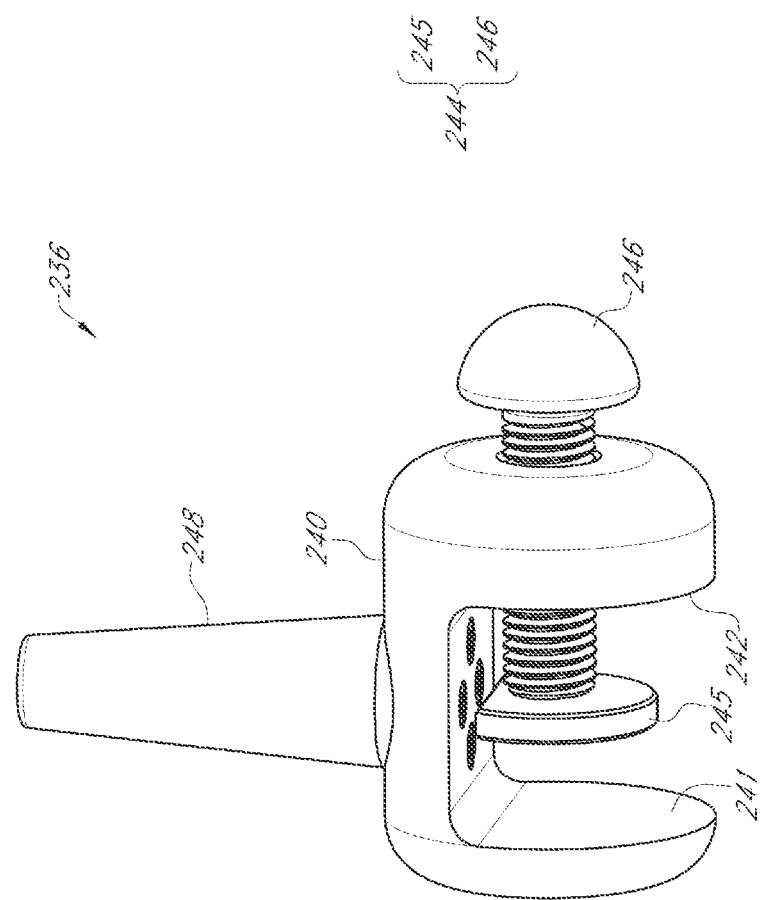

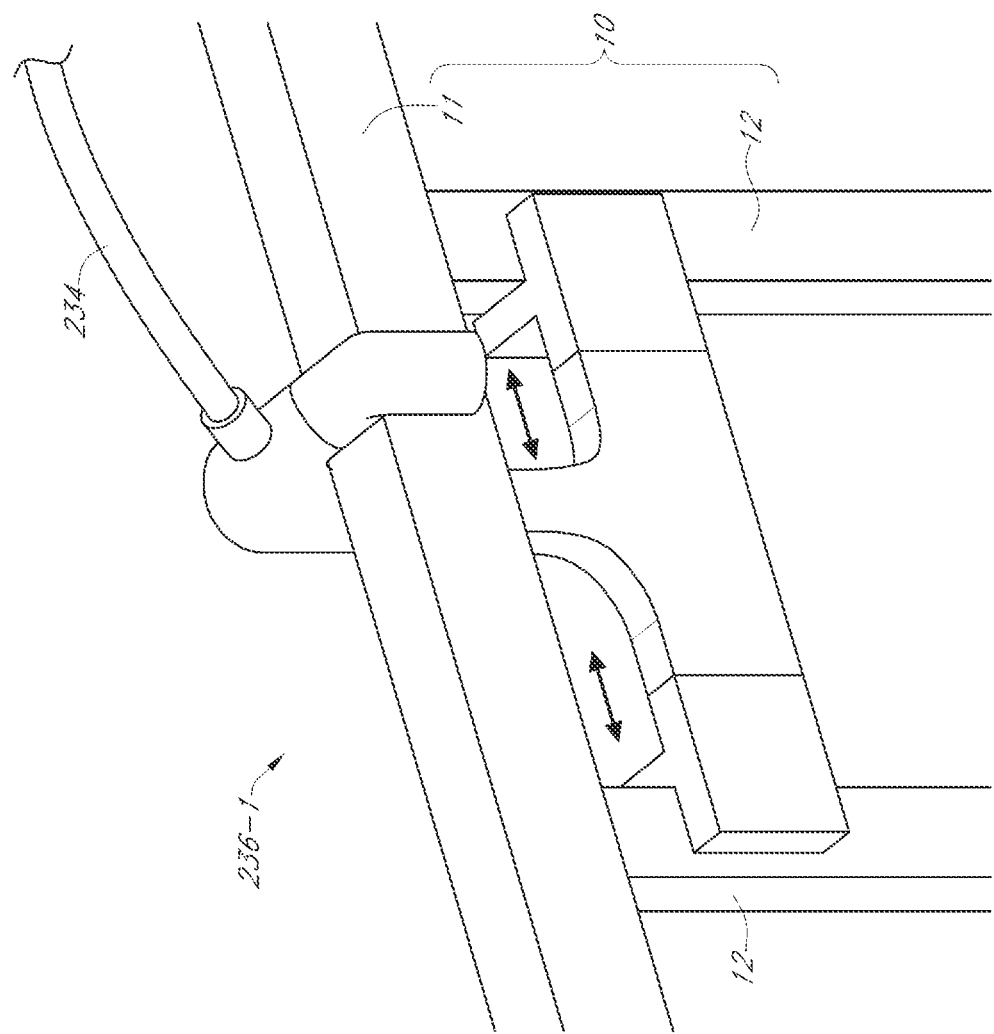

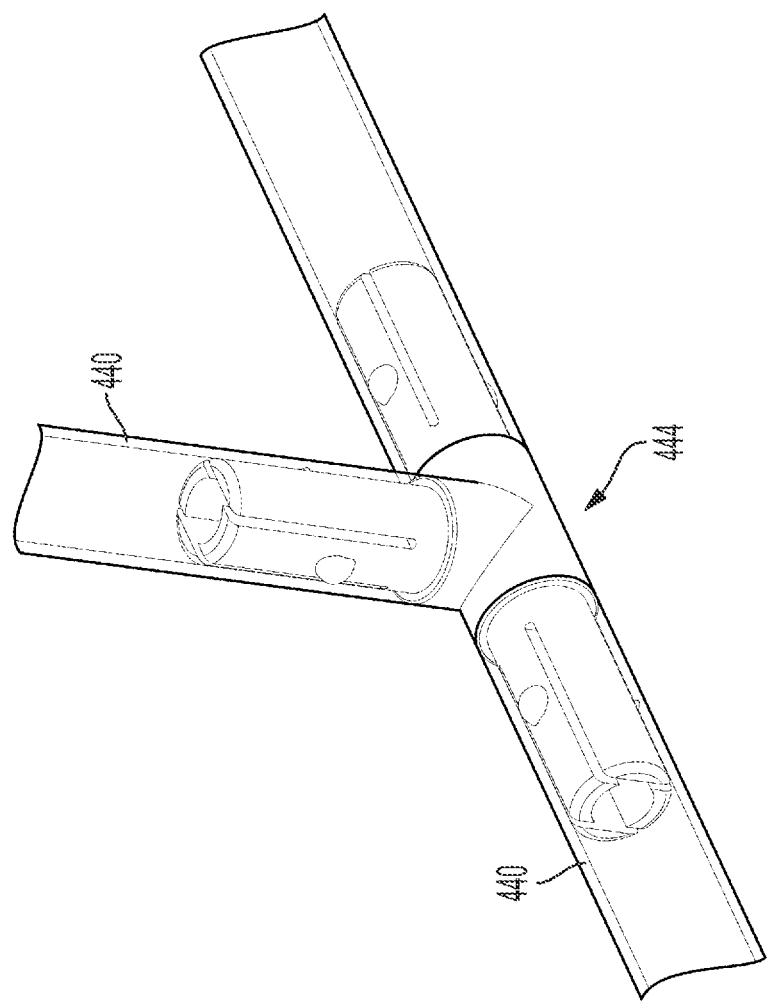
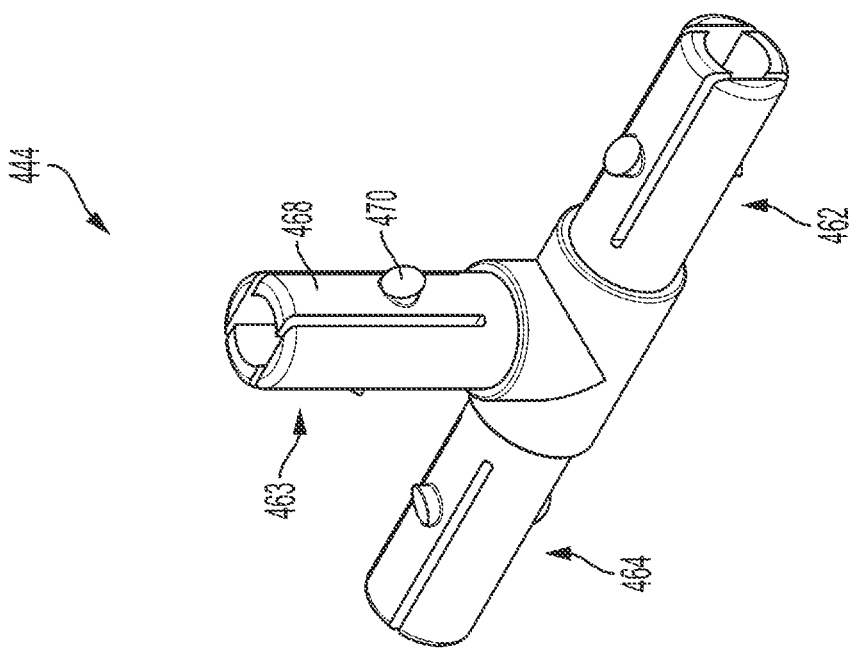
FIG. 19D
FIG. 19C

ANTI EMF RADIATION PROTECTIVE HOUSING

CROSS-REFERENCE TO RELATED APPLICATION(S)

This application is a continuation-in-part (CIP) of U.S. application Ser. No. 17/119,177 ("ANTI EMF RADIATION PROTECTIVE HOUSING"), filed on Dec. 11, 2020, which is a continuation of U.S. application Ser. No. 16/726,030 ("ANTI EMF RADIATION PROTECTIVE HOUSING"), now U.S. Pat. No. 10,869,414, filed on Dec. 23, 2019, which is a continuation of U.S. application Ser. No. 16/370,490 ("ANTI EMF RADIATION PROTECTIVE HOUSING"), filed on Mar. 29, 2019, now U.S. Pat. No. 10,542,642, which claims priority to, and the benefit of, U.S. Provisional Application No. 62/650,836 ("ANTI-EMF RADIATION PROTECTIVE HOUSING"), filed on Mar. 30, 2018, the entire contents of which are incorporated herein by reference.

FIELD

The present invention relates to the field of protective housings for shielding bodies from radiation.

BACKGROUND

In today's modern world, people are constantly exposed to electromagnetic field (EMF) radiation, which is typically emitted from electric power lines, cell phone base stations, wireless electronic devices such as cell phones and wifi-base stations, appliances such as microwave machines, etc. Recent studies on the effect of radiation on biological tissue have found that EMF radiation can penetrate infants and toddlers at a significantly higher magnitude than adults, due to the adolescent and immature bone density of young children, specifically in the skull region. While the scientific community has yet to come to a conclusive opinion on the potentially harmful effects of long term exposure to electromagnetic field radiation, there are a plethora of studies indicating that the potential for harm is something that cannot be ignored and should be researched further. Accordingly, many are concerned about the potential harmful effects that EMF exposure may have on their infants and toddlers, especially while the infant or toddler is sleeping.

What is desired is a device that reduces or minimizes the potential risks of EMF radiation to the vulnerable state of infants and toddlers, for those who deem the risk to be of substance.

The above information disclosed in this Background section is only for enhancement of understanding of the invention, and therefore it may contain information that does not form the prior art that is already known to a person of ordinary skill in the art

SUMMARY

Aspects of some embodiments of the present invention are directed toward an apparatus for cancelling, or substantially reducing the intensity of, incoming electromagnetic field radiation emitted from an external source such as a cell phone, a wifi device, power lines, industrial complexes, etc. In some embodiments, the apparatus may be installed around a crib/basinet as an accessory that may shield the crib from said electromagnetic field radiation.

According to some embodiments of the present invention, there is provided a protective housing for shielding against electro-magnetic field (EMF) radiation, the protective housing including: a conductive mesh; a frame coupled to the conductive mesh and configured to define a shape of the conductive mesh; and a frame cover coupled to the frame and the conductive mesh, the frame cover including: a main body coupled to the frame; a first swivel portion rotatably coupled to a first end of the main body; and a second swivel portion rotatably coupled to a second end of the main body, the first and second swivel portions corresponding to an entry of the protective housing.

In some embodiments, the conductive mesh has a slit formed by a first edge and a second edge of the conductive mesh, the slit providing the entry to an interior space of the protective housing when the first and second swivel portions are open, and the second edge of the slit includes a plurality of magnets positioned along the second edge.

In some embodiments, the frame cover further includes: a linkage coupled to and suspended from the first swivel portion, the linkage being fixedly coupled to the first edge of the conductive mesh, and the second edge is configured to align with and magnetically couple to the linkage.

In some embodiments, the linkage is foldable and includes two u-beams coupled together via a rotational joint, and the first edge of the conductive mesh is coupled to the two u-beams via a bolt mechanism.

In some embodiments, the frame includes: a base frame portion; a suspended frame portion configured to support the conductive mesh, the conductive mesh being draped over the suspended frame portion; and a plurality of support members configured to support the suspended frame portion above the base frame portion.

In some embodiments, a support member of the plurality of support members includes: a support arm configured to extend from the base frame portion to the suspended frame portion; and a first clamp member configured to securely couple a first end of the support arm to the suspended frame portion, the first clamp member including: a stem portion configured to securely engage with the support arm; and a sleeve fixedly coupled to the stem portion and having two opposing arcuate lips curvedly extending from a centerline portion of the sleeve, the opposing arcuate lips being configured to securely wrap around a portion of the suspended frame portion, wherein the opposing arcuate lips define a channel therebetween extending in a direction crossing an extension direction of the stem portion.

In some embodiments, each of the opposing arcuate lips increases in thickness from a corresponding edge to the centerline portion of the sleeve, and the centerline portion of the sleeve has a notch extending along a lengthwise direction of the channel.

In some embodiments, the stem portion includes: a pair of beam portions extending away from the sleeve along a lengthwise direction of the stem portion, and configured to mate with an end of the support arm, wherein each of the pair of beam portions has a pin protruding away from the corresponding beam portion and configured to clip into a corresponding hole in the support arm.

In some embodiments, the support member of the plurality of support members further includes: a second clamp member configured to securely couple a second end of the support arm to the base frame portion.

In some embodiments, at least one of the base frame portion and the suspended frame portion includes a clip-in coupling including: a central portion; and a coupling end portion coupled to the central portion and configured to be inserted into and mate with a portion of the base frame portion or the suspended frame portion.

In some embodiments, the coupling end portion includes: a pair of beam portions extending away from the central portion, each of the pair of beam portions having a pin protruding in a direction crossing a lengthwise direction of the coupling end portion, the pair of beam portions being configured to bend toward each other as the coupling end portion is inserted into the portion of the base frame portion or the suspended frame portion.

In some embodiments, the base frame portion has an indented portion corresponding to the entry of the protective housing.

In some embodiments, each of the suspended frame portion and the frame cover have a generally rectangular shape.

In some embodiments, the protective housing further includes: a conductive plane below the base frame portion and configured to be a grounding plane for the protective housing, the conductive plane and the conductive mesh being configured to shield an interior space, defined by the conductive plane and the conductive mesh when suspended, against EMF radiation.

In some embodiments, the conductive mesh has a first portion and a second portion corresponding to the entry of the protective housing, and the first portion of the conductive mesh is electrically coupled to the conductive plane.

In some embodiments, a circumference of the first portion of the conductive mesh is physically attached to the conductive plane.

In some embodiments, the conductive mesh is configured to shield an interior of the protective housing against EMF radiation.

In some embodiments, the conductive mesh has a mesh size configured to permit the conductive mesh to be flexible to drape around the frame and to be breathable and see-through.

In some embodiments, the conductive mesh includes: a flexible and breathable fabric having an electrically-conductive coating, the flexible and breathable fabric including at least one of a polyamide, a polyester, cotton, polyethylene, and polypropylene, and the electrically-conductive coating includes at least one of silver (Ag), gold (Au), aluminum (Al), copper (Cu), chromium (Cr), iron (Fe), manganese (Mn), tin (Sn), titanium (Ti), tungsten (W), platinum (Pt), nickel (Ni), cobalt (Co), barium (Ba), indium (In), palladium (Pd), bismuth (Bi), niobium (Nb), selenium (Se), zinc (Zn), vanadium (V), mercury (Hg), and cadmium (Cb).

BRIEF DESCRIPTION OF THE DRAWINGS

The accompanying drawings, together with the specification, illustrate exemplary embodiments of the present invention, and, together with the description, serve to explain aspects of embodiments of the present invention. In the drawings, like reference numerals are used throughout the figures to reference like features and components. The figures are not necessarily drawn to scale. The above and other features and aspects of the present invention will become more apparent from the following detailed description of illustrative embodiments thereof with reference to the attached drawings, in which:

FIG. 7C illustrates a closer view of the region C of FIG. 7B;

FIG. 10A illustrates a perspective view of the securing member, according to some exemplary embodiments of the present invention;

FIG. 11A illustrates a perspective view of the securing member firmly secured to an object, according to some other exemplary embodiments of the present invention;

FIG. 19C illustrates a T clip-in coupling of the frame, according to some exemplary embodiments of the present invention.

FIG. 19D illustrates the T clip-in coupling that connects together two support arms of the frame, according to some exemplary embodiments of the present invention.

DETAILED DESCRIPTION

The detailed description set forth below is intended as a description of example embodiments of a system and method for defect detection, provided in accordance with the present invention, and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Aspects of some embodiments of the present invention are directed to a universal anti electromagnetic field (EMF) radiation protective system (also referred to as an EMF protection system or protective housing) for encompassing and protecting an individual (e.g., an infant) inside the EMF protective system from external EMF radiation. In some embodiments, the EMF protection system utilizes a conductive fabric coupled to a grounding plane (e.g., grounding sheet or plate) to shield its interior space from external EMF radiation. In some examples, the encompassed entity may be a toddler, and infant, or an adolescent child.

Figure 1:
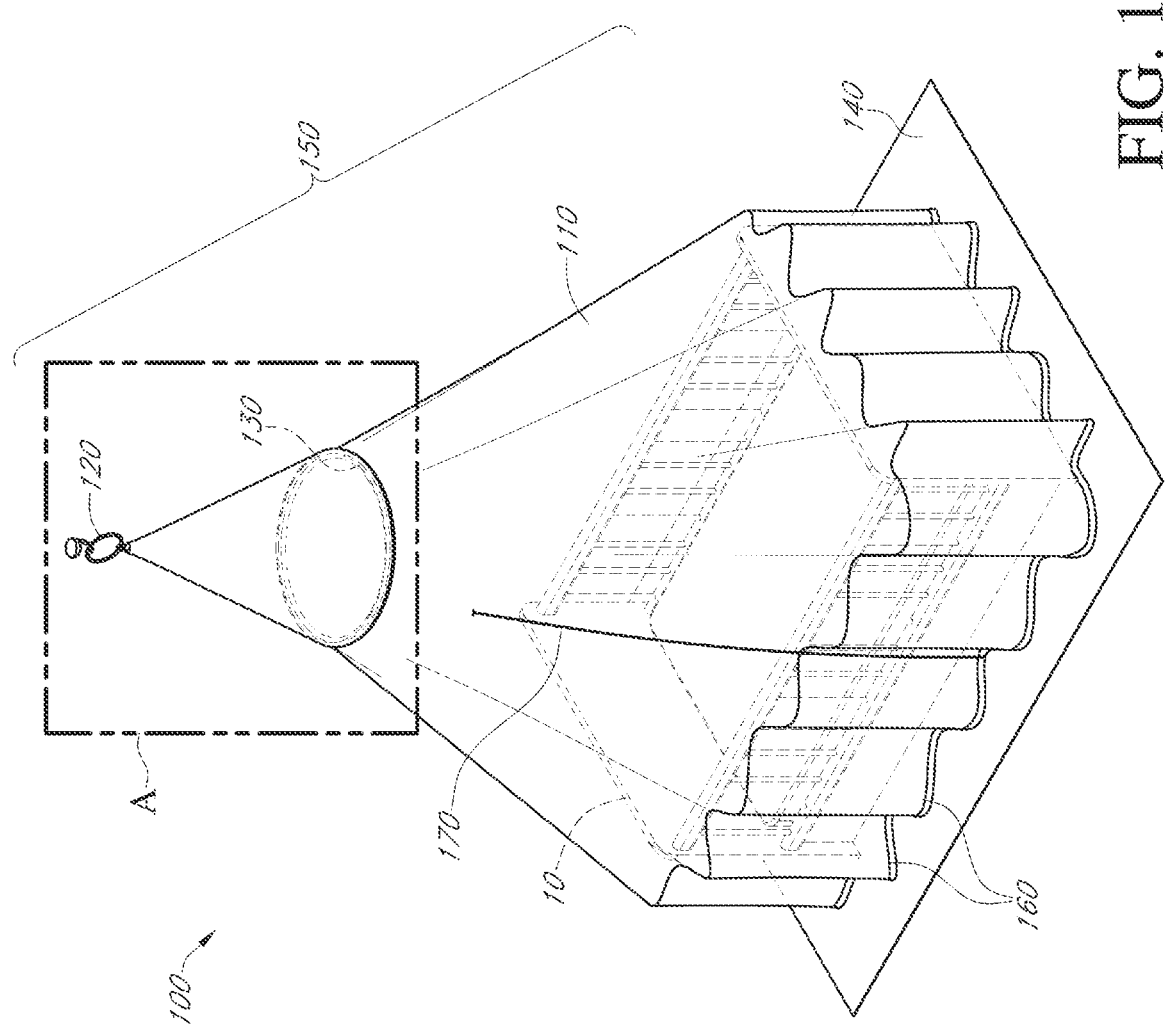
FIG. 1 illustrates a perspective view of an EMF protection system, according to some exemplary embodiments of the present invention.
Figure 2:
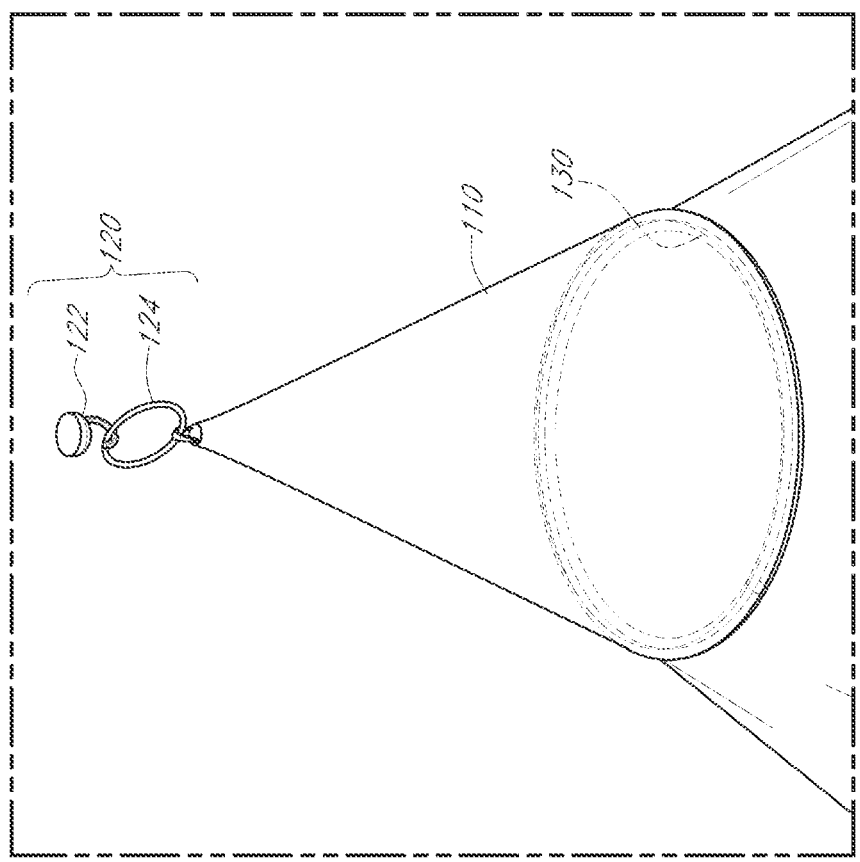
FIG. 2 illustrates a top portion of the EMF protection system within region A of FIG. 1.
Figure 3:
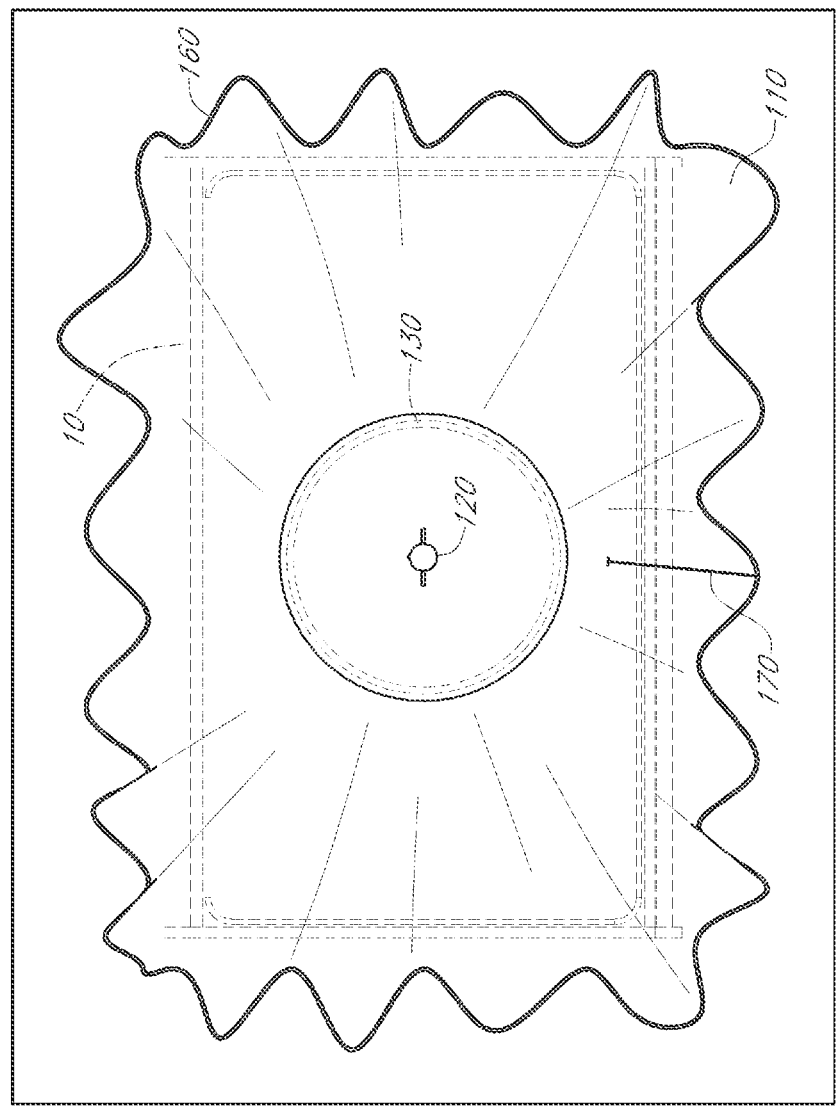
FIG. 3 illustrates a top view of the EMF protection system of FIG. 1.

FIG. 1 illustrates a perspective view of an EMF protection system 100, according to some exemplary embodiments of the present invention. FIG. 2 illustrates a top portion of the EMF protection system 100 within region A of FIG. 1. FIG. 3 illustrates a top view of the EMF protection system 100 of FIG. 1.

Referring to FIG. 1, the EMF protection system (e.g., protective housing) 100 includes a conductive mesh (e.g., a conductive fabric or an anti-EMF fabric) 110 for encompassing an object 10, a suspender 120 for supporting/suspending the conductive mesh 110 above the object 10 from an elevated position, a frame (e.g., an overhead structural frame) 130 for giving shape to the conductive fabric and defining an interior volume of the conductive mesh 110, a conductive plane (e.g., a conductive/grounding sheet or plate) 140 at the base of the EMF protection system 100 and configured to act as a grounding plane for EMF protection system 100, and a coupler configured to electrically couple the conductive mesh 110 to the conductive plane 140. According to some examples, an object (e.g., a crib or a bassinet) may be placed on top of the conductive plane 140 and within the interior space of the conductive mesh 110. In some embodiments, when suspended (e.g., hung from the ceiling), the conductive mesh 110, the frame 130, and the suspender 120 together form a canopy 150. The EMF protection system 100 further includes a cable (e.g., a conductive cable) 160 coupled to a circumference of the conductive mesh 110 and configured to both weigh down the conductive mesh 110 to provide suitable draping and to electrically connect the conductive mesh 110 to the grounding plane of the conductive plane 140.

The conductive mesh 110 is designed based on the principals of a faraday cage. According to some embodiments, the conductive mesh 110 includes one or more layers of a fine metal mesh or metallic fabric that are flexible, breathable, and at least partially see-through. The conductive outer surface that the conductive mesh 110 creates an electrically polar charge on either side of the conductive mesh 110 where, for example, one side of the outer surface is positively charged while the other side is negatively charged. This creates a net neutral electrical environment within the confines of the conductive mesh 110, thus effectively shielding the interior of the faraday cage from electromagnetic field signals. In some examples, the EMF protection system 100 may eliminate/cancel incoming EMF signals of about −120 dBm to about −30 dBm (e.g., about −120 dBm to about −50 dBm) in signal strength. This reduction in incoming EMF signals may be sufficient to prevent an off the shelf cell phone from receiving or transmitting phone calls when encompassed by the EMF protection system 100.

In addition to being conductive, it is desirable for the conductive mesh 110 to exhibit flexibility, breathability and (at least partial) transparency. For example, flexibility of the conductive mesh 110 allows it to take any suitable shape and to effectively contour/drape across the object 10. Breathability of the conductive fabric is desired for maintaining adequate air flow through the conductive mesh 110 and for maintaining a suitable temperature (e.g., a temperature substantially the same as the exterior ambient temperature) within the confines of the EMF protection system 100. Further, it may be desirable for the conductive mesh 110 to be at least partially transparent to allow an outside observer (e.g., a parent) to easily monitor the individual (e.g., the child) placed within the EMF protection system 100.

In some embodiments, the conductive mesh 110 includes a fabric having an electrically-conductive coating or a weave of conductive threads. In some examples, the base fabric material may include polyamides (e.g., Nylon 6 or Nylon 66), polyethylene terephthalate (PET, also referred to as polyester), cotton, polyethylene, polypropylene, a combination thereof, and/or the like. The fabric may be coated with, or have conductive threads including, an electrically conductive material including silver (Ag), gold (Au), aluminum (Al), copper (Cu), chromium (Cr), iron (Fe), manganese (Mn), tin (Sn), titanium (Ti), tungsten (W), platinum (Pt), nickel (Ni), cobalt (Co), barium (Ba), indium (In), palladium (Pd), bismuth (Bi), niobium (Nb), selenium (Se), zinc (Zn), vanadium (V), mercury (Hg), cadmium (Cb), and/or the like.

In some examples, the conductive fabric may have a mesh density of about 8 mesh/cm to about 47 mesh/cm. In some examples, the conductive mesh 110 may have a mesh size (e.g., opening size) of about 0.5 mm. The fabric thickness may be about 0.005 inches to about 0.009 inches (e.g. about 0.007 inches). The fabric may have a weight that is about 20 g/m^2 to about 34 g/m^2, and exhibit an electrical resistivity of about 0.7 ohm/cm to about 8 ohm/cm. As will be understood by a person of ordinary skill in the art, the values provided above are merely for illustrative purposes, and the present invention is not limited thereto. That is, the thickness, mesh size, material of the conductive mesh 110 may be suitably varied to balance electrical conductivity against flexibility, breathability, and visibility. For example, while increasing the fabric thickness and reducing the mesh size may reduce the resistivity of the conductive mesh 110 even further, thus yielding even greater EMF protection, it may also reduce its flexibility, breathability, and transparency, which may be undesirable in some applications.

Referring to FIGS. 1-3, in some embodiments, the EMF protection system 100 utilizes an overhead canopy design that may be suspended from an elevated position (e.g., hung from the ceiling or attached to a wall mount) via the suspender 120. In some examples, the suspender 120 may include an eyelet (or hook or any suitable securing mechanism) 122 coupled to a ring 124 that is affixed to an end (e.g., a canopy tip) of the conductive mesh 110.

According to some embodiments, the shape (e.g., the conical shape) of the flexible conductive mesh 110 is maintained by a frame (e.g., a structural frame) 130 that is vertically offset from the suspender 120 when suspended and positioned near the top of the canopy 150. In some embodiments, the frame 130 may be secured to conductive mesh the via ties located inside the canopy 150 that allow the ring to be removed for easy folding, transport, or storage. However, embodiments of the present invention are not limited thereto, and the frame 130 may be secured via any suitable securing mechanism. For examples, the frame 130 may be sown or adhered to the conductive mesh 110. In some embodiments, the frame 130 is ring shaped which allows the canopy 150 formed by the conductive mesh 110 to have a conical shape. However, embodiments of the present invention are not limited thereto, and the frame 130 may have any suitable shape, such as an oval, a rectangle, a trapezoid, a pentagon, and/or the like.

Figure 4:
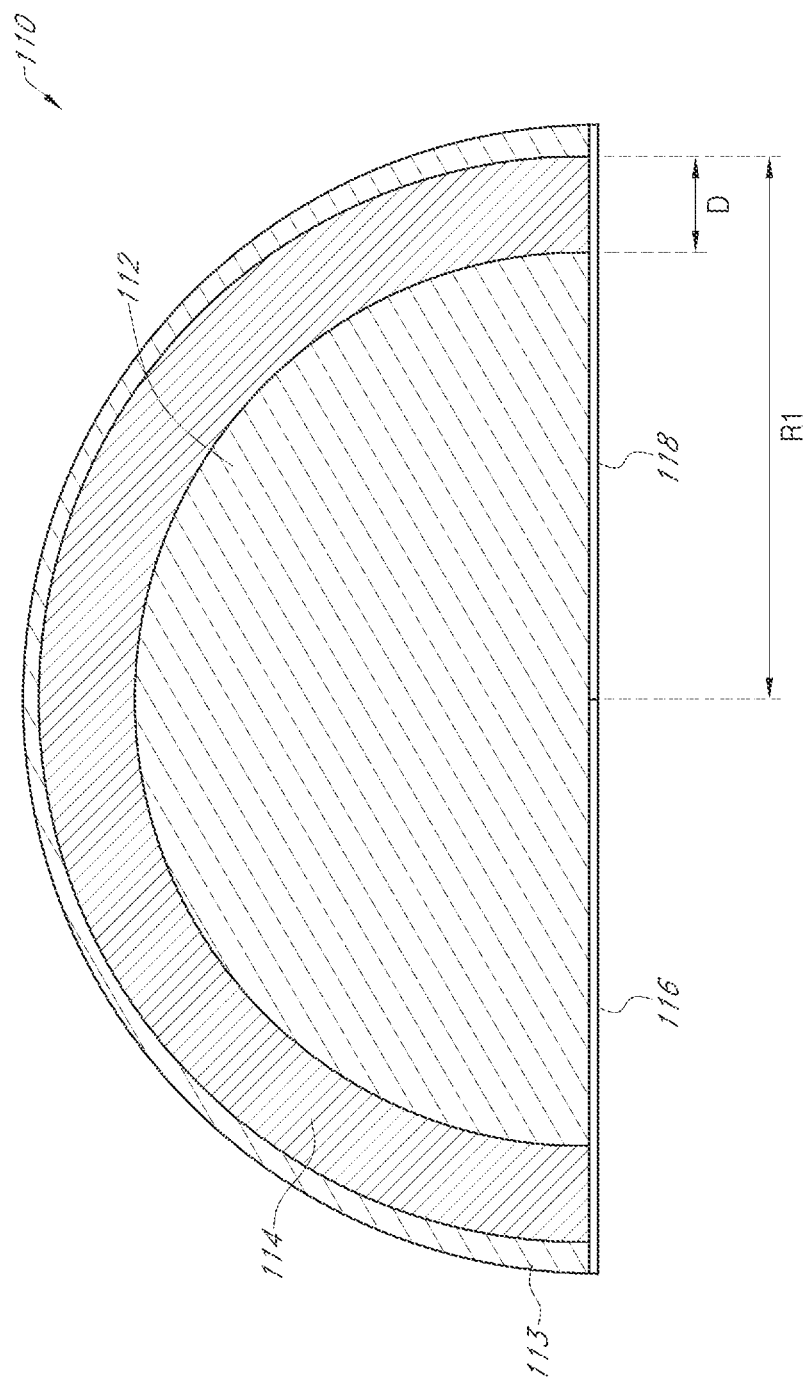
FIG. 4 illustrates a schematic view of the conductive mesh when laid out flat, according to some exemplary embodiments of the present invention.

FIG. 4 illustrates a schematic view of the conductive mesh 110 when laid out flat, according to some exemplary embodiments of the present invention.

According to some embodiments, in order to produce a canonical canopy 150, the conductive mesh 110 is cut into a half circle shape with its straight edges 116 and 118 being brought together to form a slit 170 that defines an opening to the interior of the EMF protection system 100, when suspended.

In some embodiments, the conductive mesh includes a first conductive layer (e.g., a base fabric) 112 and a second conductive layer (e.g., a supplemental fabric) 114 partially overlapping the first conductive layer 112, which serves to increase the electrical conductivity of the conductive mesh 110 and hence improve (e.g. increase) the EMF shielding of the EMF protection system 100. According to some embodiments, the first conductive layer 112 has a smaller mesh size and greater conductivity (e.g., higher silver content) than the second conductive layer 114.

In some examples, the second conductive layer 14 may have a substantially half-ring shape (e.g., a half annulus shape) that overlaps with (e.g., covers) the bottom portion of canopy 150. The second conductive layer 114 may be affixed to (e.g., sown onto and/or adhered to) the first conductive layer 112. By covering the bottom portion of the canopy 150, according to some examples, the second conductive layer 114 improves the EMF shielding effect near the area in which the infant or toddler may be resting, without meaningfully affecting the breathability and transparency of the canopy 150. However, embodiments of the present invention are not limited thereto, and the second conductive layer 114 may overlap with the first conductive layer 112 up to a mid-point of the canopy 150 or even near the top of the canopy, depending on the application of the canopy 150.

In some examples, the first conductive layer 112 of the conductive mesh 110 may have a radius R1 of about 80 inches to about 130 inches (e.g., about 103.5 inches), and the second conductive layer 114 of the conductive mesh 110 may have a radial width D of about 30 inches to about 60 inches (e.g., about 48 inches).

Figure 5A:
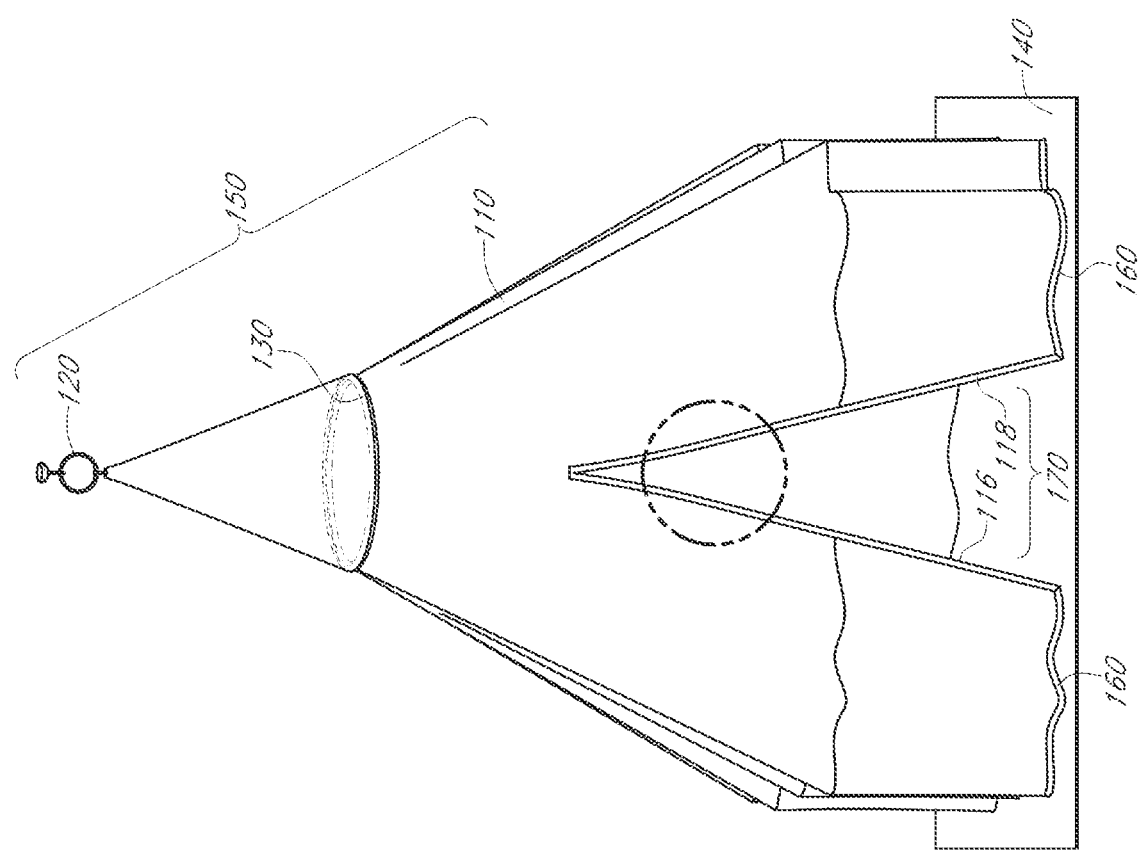
FIG. 5A illustrates a front view of the EMF protection system showing a slit defining an opening according to some exemplary embodiments of the present invention.
Figure 5B:
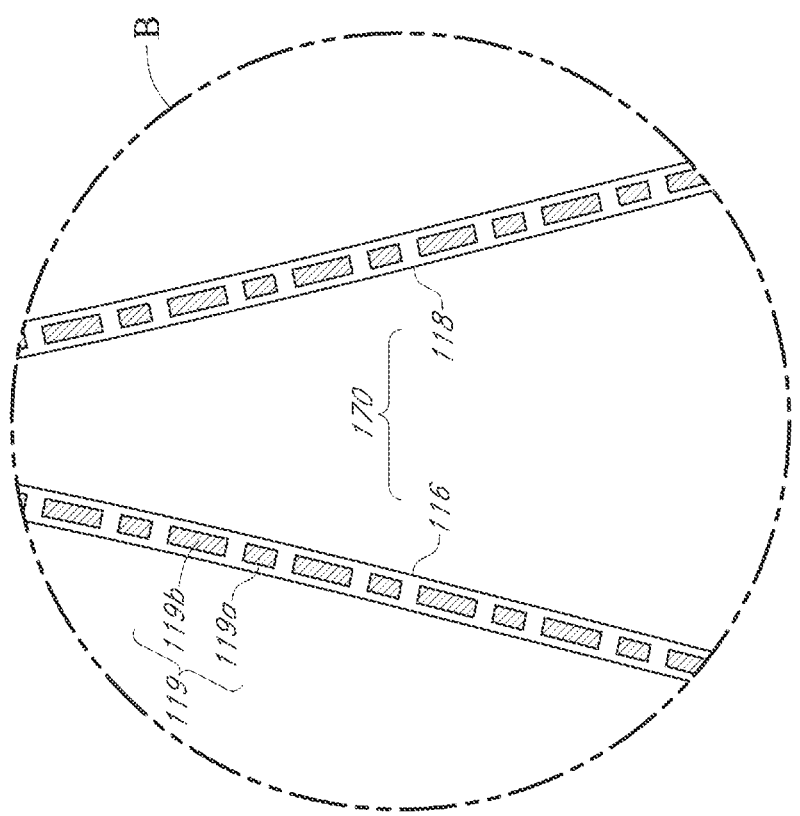
FIG. 5B illustrates a closer view of the region B of FIG. 5A, according to some exemplary embodiments of the present invention.

FIG. 5A illustrates a front view of the EMF protection system 100 showing the slit 170 defining an opening according to some exemplary embodiments of the present invention. FIG. 5B illustrates a closer view of the region B of FIG. 5A, according to some exemplary embodiments of the present invention.

Referring to FIGS. 5A-5B, the edges 116 and 118 of the conductive mesh 110 form a slit 170, when separated, that can provide access to the interior of the canopy 150. The edges 116 and 118 may also be coupled together (e.g., fastened together) via a suitable means to close the slit 170 (and hence close the opening) and enable proper shielding of EMF radiation. According to some embodiments, each of the edges 116 and 118 includes (e.g., has fastened to it) a plurality of magnets 119 that are lined along the corresponding edges 116/118. The magnets 119 may be brought together to ensure a close and tight connection between the edges 116 and 118 when the opening is close. Further, as the magnets 119 along the edge 116 are naturally drawn to the magnets 119 along the edge 118, they facilitate the self-closing of the slit 170.

In some embodiments, the magnets 119 along each of the edges 116 and 118 represent an alternating pattern of magnets (e.g., rare earth magnets) including shorter and stronger magnets 119a and longer and weaker magnets 119b. The pattern of magnets 119 at either side of the slit 170 (along the edges 116 and 118) may be mirrors of one another. The alternating pattern of magnets 119 may allow for optimal alignment of the edges 116 and 118 and ensure proper closure of the opening. In some examples, the long magnets (e.g., longer magnets) 119b are intended to do the alignment as their longer body provides more contact area that can be used to line up the edges 116 and 118. The short magnets (e.g., shorter magnets) 119a may be more powerful magnets than the long magnets 119b, and thus ensure that the connection between both edges 116 and 118 has adequate force to maintain closure. In some examples, the long magnets 119b may have the same strength as the short magnets 119a; however, this may lead to higher costs. In some examples, the short magnets 119a may be about 1 inch in length and the long magnets 119b may be about 2 inches to about 3 inches in length. The magnets 119 may be attached to the fabric by being secured within sown slots along the edges 116 and 118. However, embodiments of the present invention are not limited thereto, and the magnets 119 may be secured to the conductive mesh using any other suitable mechanism, such as an adhesive and/or the like. Further, in some examples, the magnets 119 may be replaced with conductive velcro or a metallic zipper that can seal the opening at the slit 170.

Figure 6B:
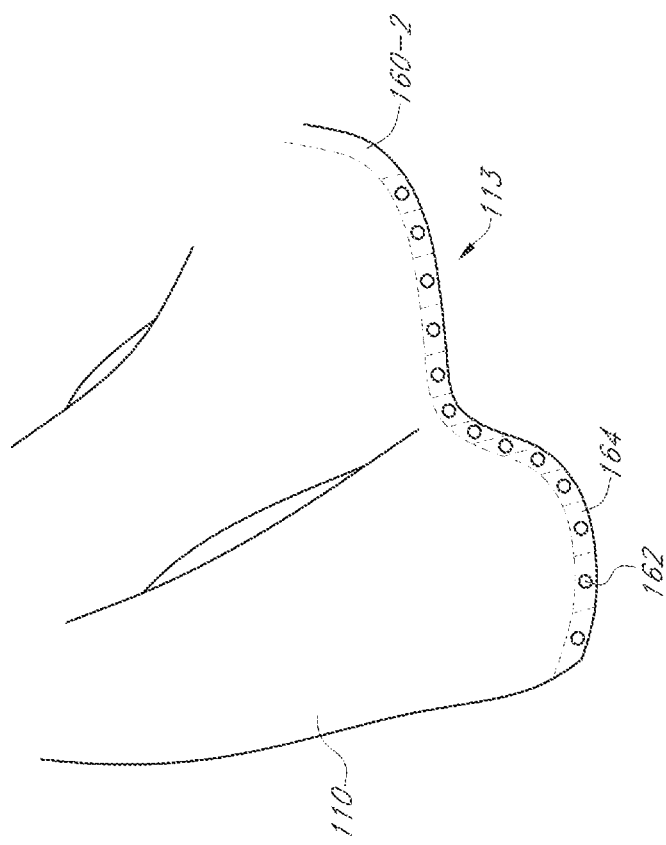
FIGS. 6A-6B illustrate a cable of the EMF protection system according to various exemplary embodiments of the present invention.
Figure 6A:
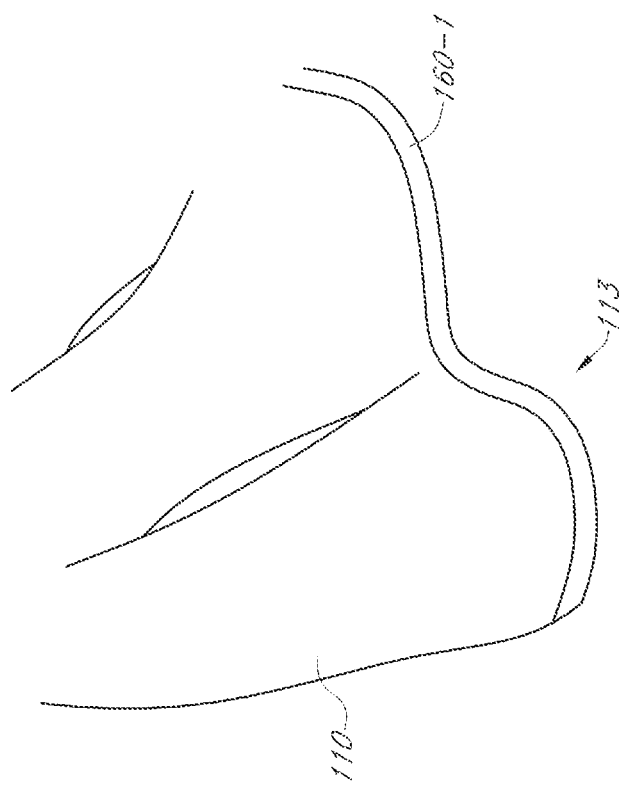

FIGS. 6A-6B illustrate the cable 160 according to various exemplary embodiments of the present invention.

Referring to FIGS. 4 and 6A-6B, in some embodiments, the cable (e.g., conductive cable) 160 is attached to the circumferential edge 113 of the conductive mesh 110 and is configured to be flexible and malleable to accommodate for the draping of the conductive mesh 110. The cable 160 may span the entire circumference of the conductive mesh 110. The cable 160 serves to not only weigh down the conductive mesh 110 to ensure a proper drape but also ensures proper contact with the conductive plane (e.g., grounding sheet) 140. In some embodiments, the cable may be made of electrically conductive material.

According to some embodiment, the cable 160 includes an electrically-conductive weighted rope (see, e.g., the cable 160-1 of FIG. 6A). In some examples, the weighted rope may be about ⅛ inches. In some other embodiments, the cable 160 includes a plurality of conductive segments (e.g., segmented metallic balls) 162 that may be attached to (e.g., affixed to or sown to) the circumferential edge 113 of the conductive mesh 110 (see, e.g., the cable 160-2 of FIG. 6B). The conductive (e.g., metallic) segments 162 may be located inside sown slots or pockets 164 at the edge 113 of the conductive mesh 110. In some examples, at least some of the conductive segments 162 may be replaced with magnetic segments (e.g., magnets) that magnetically couple the conductive mesh 110 to the conductive plane 140.

According to some embodiments, the conductive plane 140 includes highly electrically-conductive material, such as aluminum, copper, iron, and/or the like, to ensure adequate electrical grounding. In some examples, the conductive plane 140 has a sheet resistance of less than 1 ohm/sq meter.

Figure 7A:
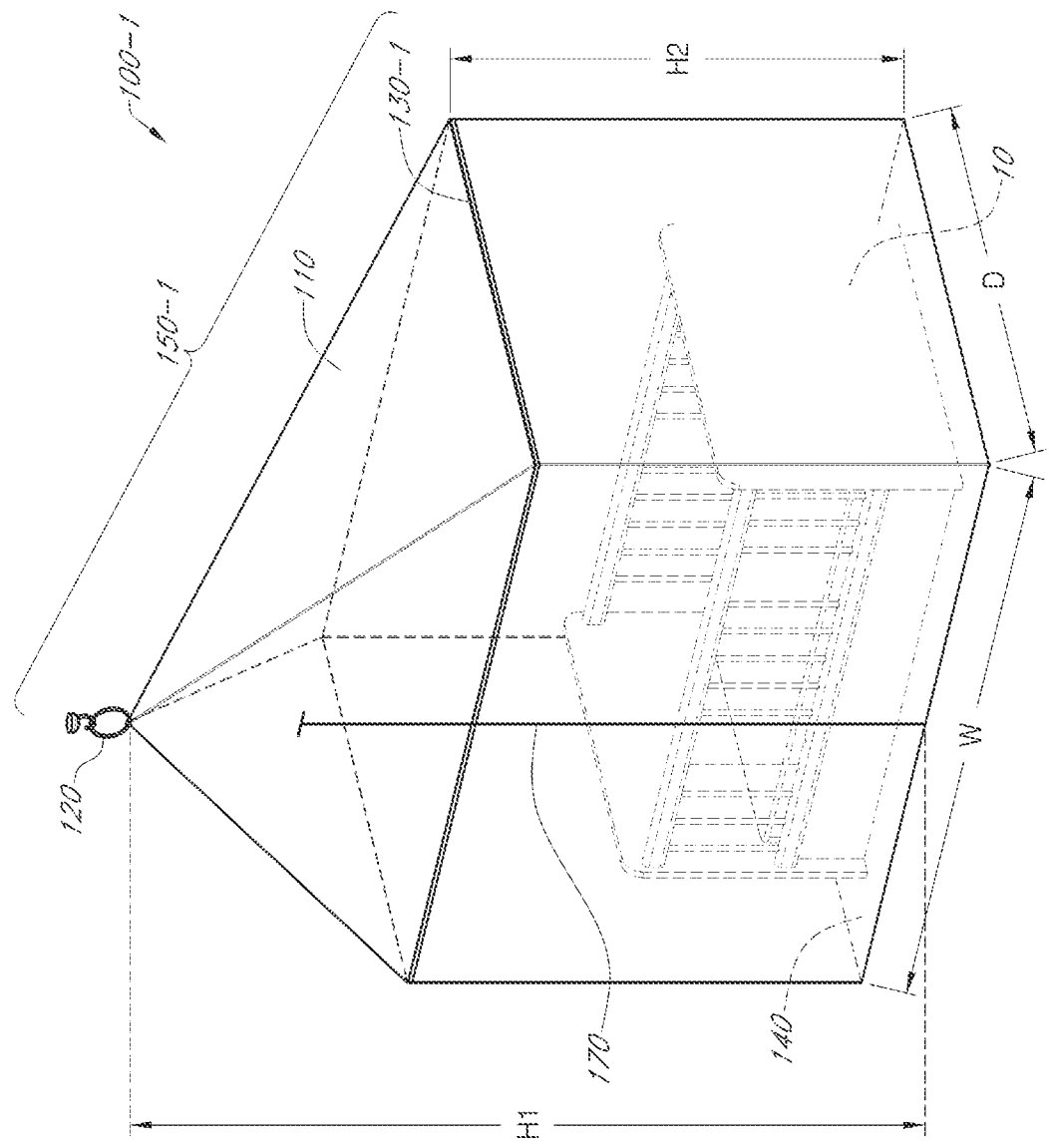
FIG. 7A illustrates a perspective view of an EMF protection system, according to some other exemplary embodiments of the present invention.
Figure 7B:
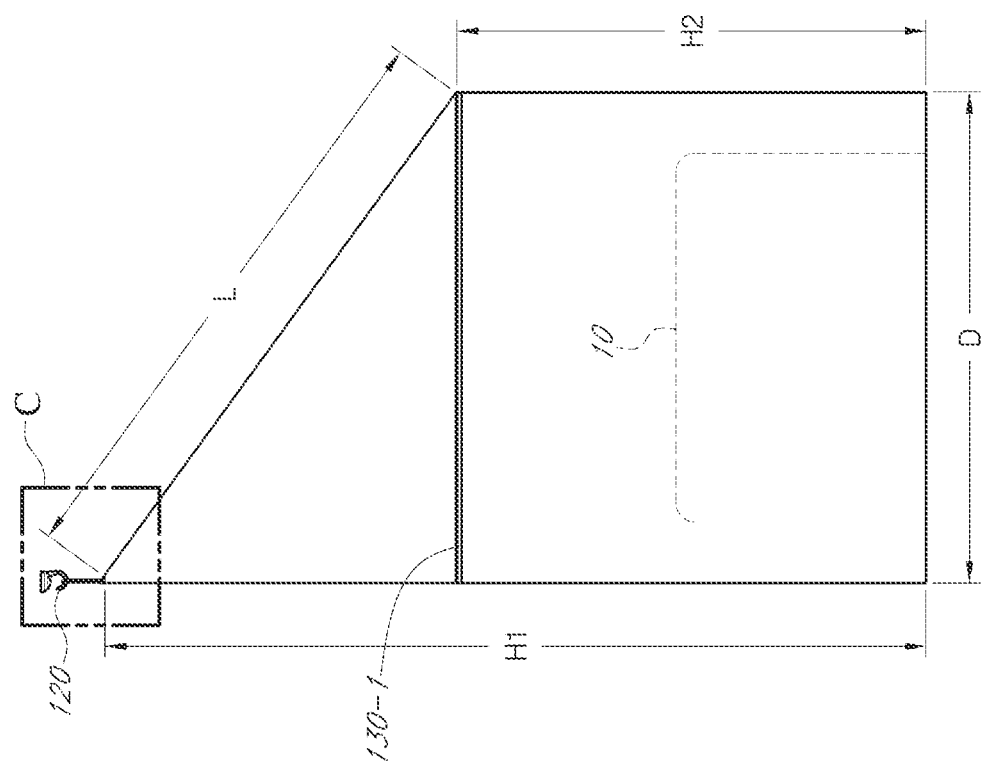
FIG. 7B illustrates a top view of the EMF protection system of FIG. 7A.

FIG. 7A illustrates a perspective view of an EMF protection system 100-1, according to some other exemplary embodiments of the present invention. FIG. 7B illustrates a top view of the EMF protection system 100-1 of FIG. 7A. FIG. 7C illustrates a closer view of the region C of FIG. 7B.

Referring to FIGS. 7A-7B, the EMF protection system (e.g., protective housing) 100-1 may be substantially the same as the EMF protection system 100 of FIG. 1, except that the conical canopy design 150 has been replaced with a prismatic canopy design 150-1. According to some embodiments, the frame (e.g., the rigid structural frame) 130-1 has a rectangular shape, which gives the conductive mesh 110 a prismatic shape.

According to some embodiments, rather than have the suspender be centrally positioned relative to the frame (as, e.g., is the case with, the EMF protection system 100 of FIGS. 1-3, the suspender 120 is mounted at or near an edge of the frame 130-1, which prevents or substantially prevents the conductive mesh 110 from sagging inwards and creates a flat (or substantially flat) vertical wall at the canopy entrance. The prismatic canopy design may increase internal volume and improve aesthetics of the EMF protection system 100-1. Further, the flat or substantially flat front plane (or front fascia) of the EMF protection system 100-1 may help to ensure that the slit 170 is completely closed without any breaks in the seal. For example, the flat or substantially flat front plane may help to ensure the proper alignment and connection of the magnets 119 along the edges 116 and 118 of the slit 170, to form a complete (e.g., unbroken) seal at the entrance of the canopy 150.

In some examples, when suspended, the frontal face of the prismatic canopy 1501-1 has a height H1 of about 72 inches to about 96 inches (e.g., about 84 inches), the back of the canopy 150-1 has a height H2 of about 36 inches to about 60 inches (e.g., about 48 inches), the depth D of the canopy 150-1 is about 38 inches to about 62 inches (e.g., about 50 inches), and the length L of the angular side of the canopy 150-1 is about 60 inches to about 84 inches (e.g., about 72 inches).

Figure 8:
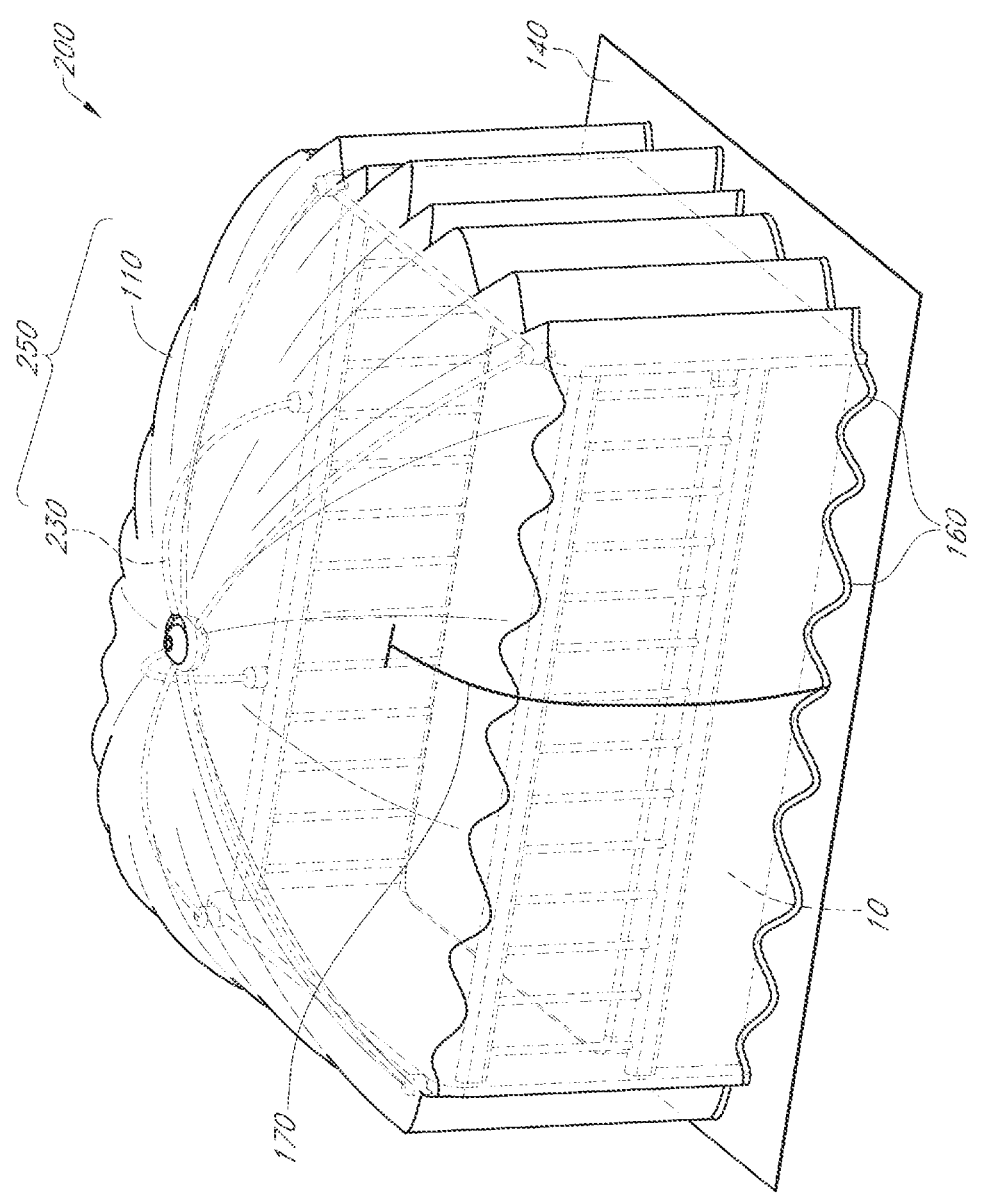
FIG. 8 illustrates a perspective view of an EMF protection system, according to still other exemplary embodiments of the present invention.
Figure 9:
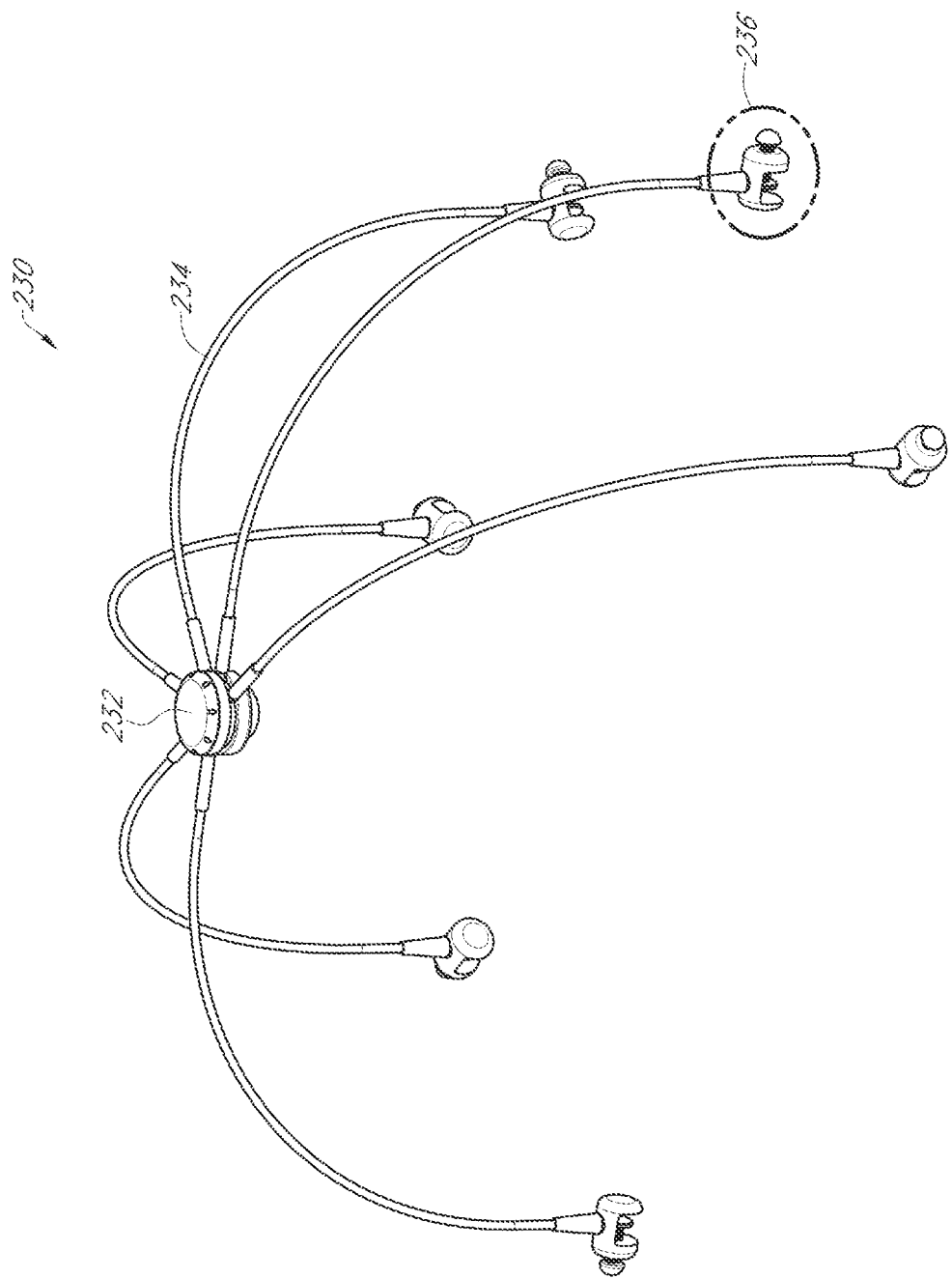
FIG. 9 illustrates a perspective view of the frame of the EMF protection system of FIG. 8.

FIG. 8 illustrates a perspective view of an EMF protection system 200, according to some exemplary embodiments of the present invention. FIG. 9 illustrates a perspective view of the frame 230 of the EMF protection system 200 of FIG. 8.

Referring to FIG. 8, the EMF protection system 200 utilizes the same or substantially the same conductive mesh 110, cable 160, conductive plane 140, and slit 170 of the EMF protection system 200. However, in the EMF protection system 200, the frame (e.g., the flexible frame or the malleable structural frame) 230 allows the conductive mesh 110 over the object 10 without being suspended from an elevated position. In some embodiments, the frame 230 acts as a malleable multi-legged stand that supports the conductive mesh 110 and defines the shape and the interior volume of the canopy 250 of the EMF protection system 200.

Referring to FIG. 9, according to some embodiments, the frame 230 includes a central body 232, a plurality of support members 234 (e.g., a plurality of malleable legs) coupled to and extending away from the central body (e.g., a central hub) 232, and a plurality of securing members (e.g., clips) 236 coupled to (e.g., fixedly coupled to) the ends of the corresponding support members 234. The securing members 236 are configured to couple (e.g., securely connect) the frame 230 to the object 10 (e.g., to the sides of the crib). In some examples, the securing member 236 may be a universal clip. According to some examples, the support member 234 may be made of a flexible/malleable material including polypropylene, polyamide, polyethylene, and or the like.

In some examples, the conductive mesh 110 may be secured to (e.g., attached to) the central body 232 (e.g., via compressive force of two components of the central body 232) and contour over the support members 234. In some examples, the conductive mesh 110 may be kept in place by a piece of velcro that sticks to the opposing end of the velcro strip located at the top of the central body 232.

FIG. 10A illustrates a perspective view of the securing member 236, according to some exemplary embodiments of the present invention. FIG. 10A illustrates an exploded perspective view of the securing member 236 of FIG. 10A.

Figure 10B:
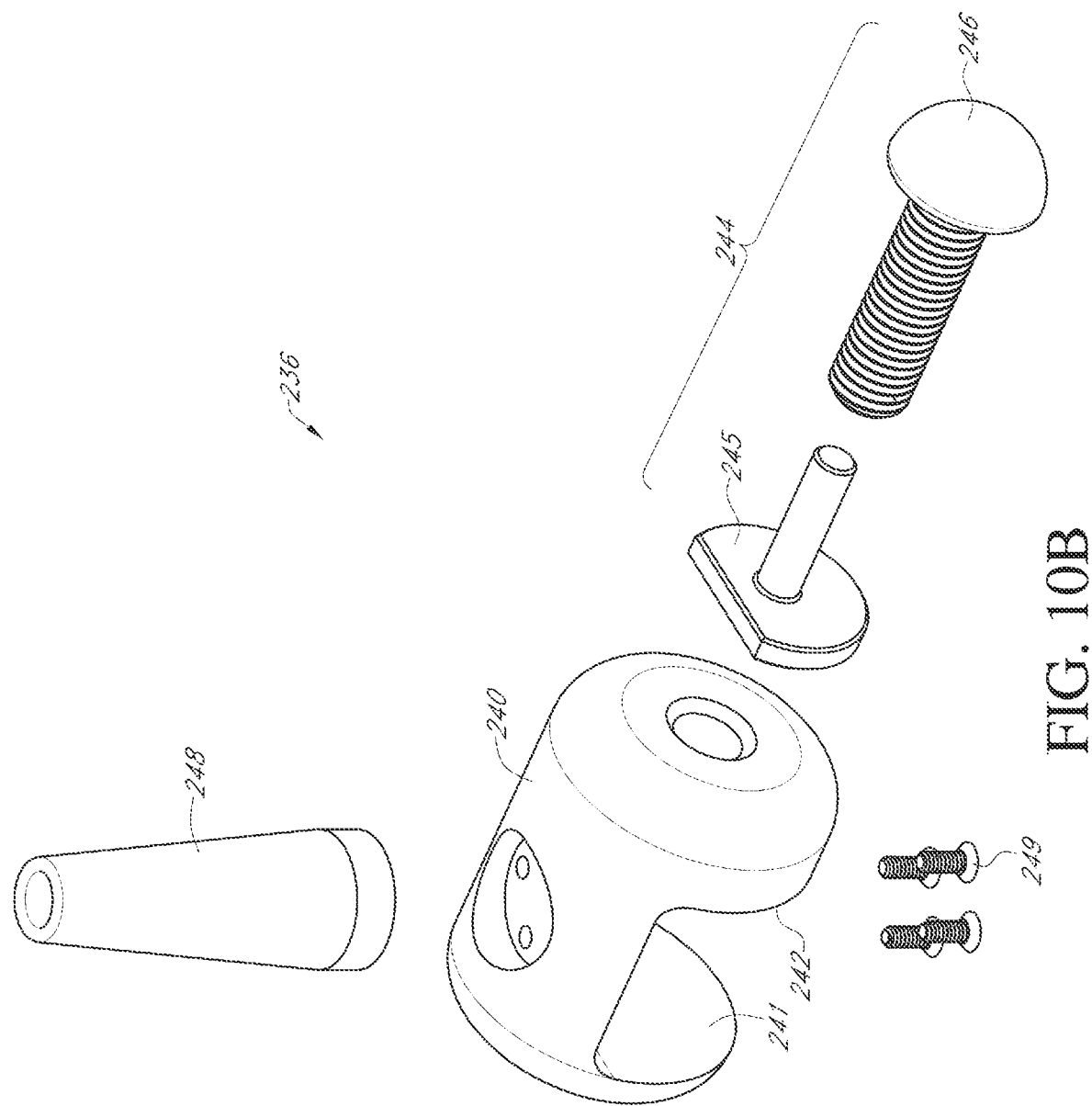
FIG. 10B illustrates an exploded perspective view of the securing member of FIG. 10A.

Referring to FIGS. 10A-10B, the securing member 236 includes a main body 240 having opposing lips 241 and 242 protruding away from the main body 240 and configured to surround a side (e.g., a side frame/rail) of the object (e.g., a crib) 10. The securing member 236 also includes a fastening mechanism (e.g., a set screw) 244 having a flat head 245 moveable between the opposing lips 241 and 242 and having an adjustable head 246 for adjusting the position of the flat head 245 between the opposing lips 241 and 242. The securing member 236 may become fixedly coupled to the object 10 by adjusting the adjustable head 246 (e.g., via a rotating tool, such as a screw driver) to firmly clamp (e.g., clasp) the object (e.g., a side of the object) 10 between the lip 241 and the flat head 245. The securing member 236 further includes a sleeve portion 248 for encompassing and coupling to an end of a corresponding supporting member 234. The sleeve portion 248 may be coupled to the main body 240 via one or more screws 249. In some examples, the sleeve 248 may be sufficiently tall such that when the supporting member 234 is inserted into the sleeve 248 and bent, the warping of the supporting member 234 secures it in place inside the sleeve 248.

Figure 11B:
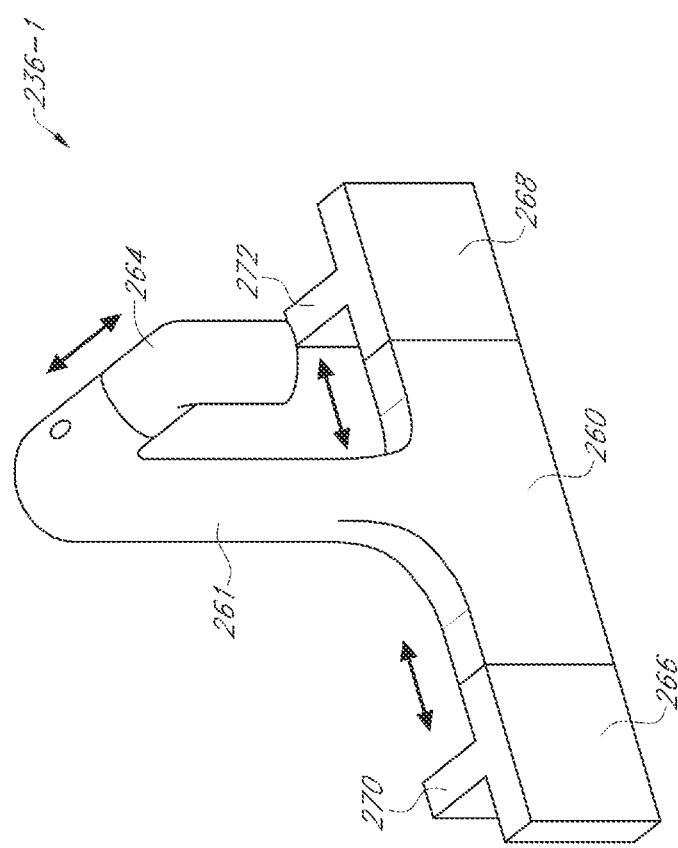
FIG. 11B illustrates a perspective view of a front of the securing member of FIG. 11A.
Figure 11C:
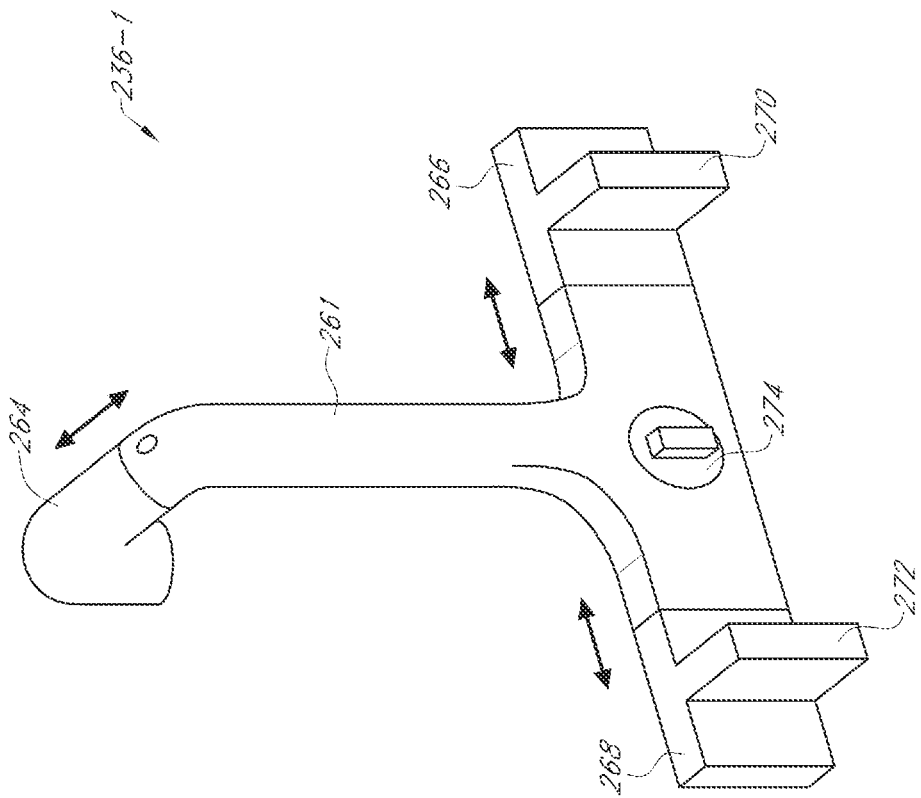
FIG. 11C illustrates a perspective view of a back of the securing member of FIG. 11A.
Figure 11D:
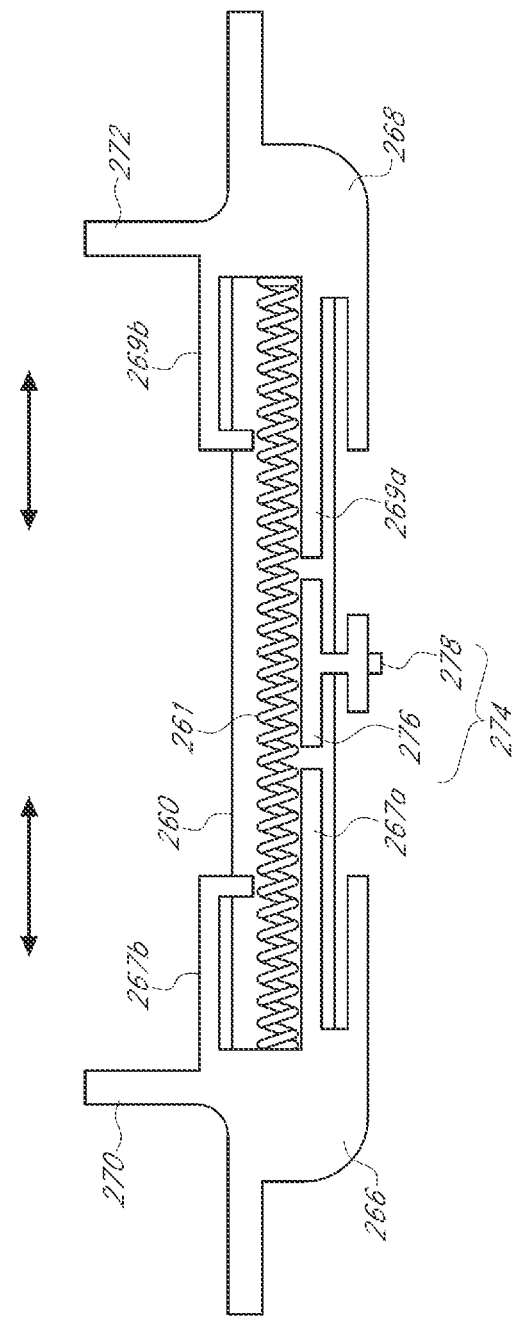
FIG. 11D illustrates a cross-sectional view of the internal mechanism of the securing member of FIG. 11A, according to some exemplary embodiments of the present invention.
Figure 11F:
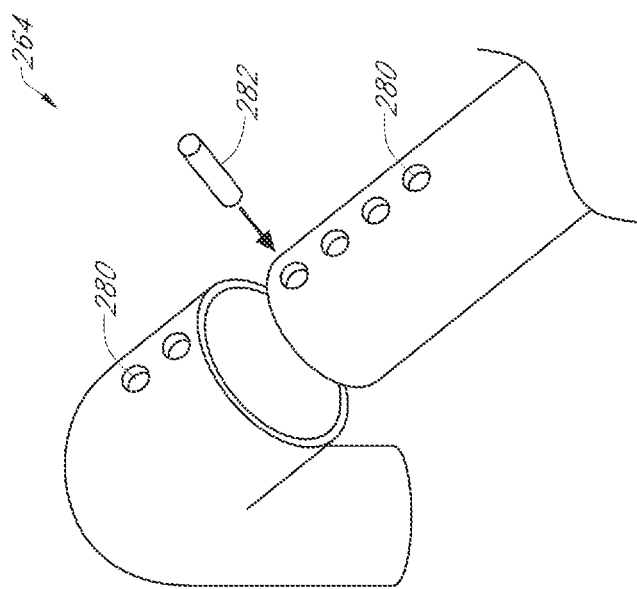
FIG. 11F illustrates the telescopic adjustability of the overhanging hook of the securing member of FIG. 11A, according to some exemplary embodiments of the present invention.
Figure 11E:
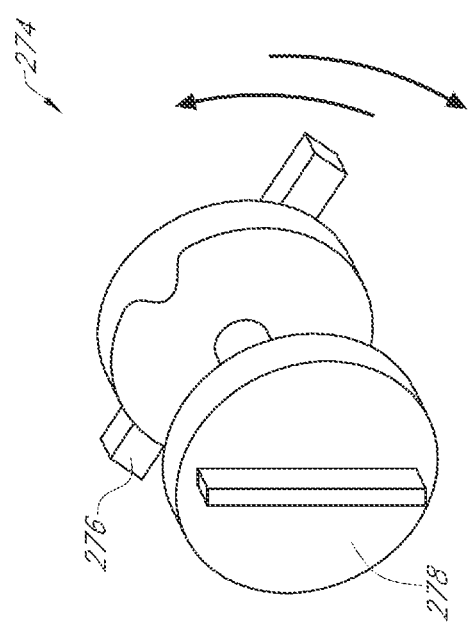
FIG. 11E illustrates a locking mechanism of the securing member, according to some exemplary embodiments of the present invention.

FIG. 11A illustrates a perspective view of the securing member 236-1 firmly secured to an object 10, according to some other exemplary embodiments of the present invention. FIG. 11B illustrates a perspective view of a front of the securing member 236-1 of FIG. 11A. FIG. 11C illustrates a perspective view of a back of the securing member 236-1 of FIG. 11A. FIG. 11D illustrates a cross-sectional view of the internal mechanism of the securing member 236-1 of FIG. 11A, according to some exemplary embodiments of the present invention. FIG. 11E illustrates a locking mechanism 274 of the securing member 236-1, according to some exemplary embodiments of the present invention. FIG. 11F illustrates the telescopic adjustability of the overhanging hook 264 of the securing member 236-1 of FIG. 11A, according to some exemplary embodiments of the present invention.

Referring to FIGS. 11A-11C, according to some embodiments, the securing member (e.g., clamp) 236-1 includes a clamp body 260 (which may have an elongated neck portion 262) and an overhanging telescopic hook 264 extending from the clamp body 260 (e.g., extending from the elongated neck portion 262), and a pair of resilient arms (e.g., spring-loaded lateral arms) 266 and 268 extending laterally from opposing sides of the clamp body 260. In some embodiments, the overhanging telescopic hook 264 is configured to engage (e.g., attach to) the top of a horizontal beam (e.g., side rail of a crib/basinet) 11 of the object 10, and the resilient arms 266 and 268 are configured to engage the vertical bars 12 of the object 10 by apply opposing lateral forces against a pair of (e.g., an adjacent pair of) vertical bars 12 via a pair of protrusions (e.g., tabs) 270 and 272 protruding from the resilient arms 266 and 268. In some examples, the protrusions 270 and 272 may extend in a direction orthogonal to the extension direction of the resilient arms 266 and 268.

Referring to FIGS. 11A-11E, according to some embodiments, the securing member 236-1 further includes a locking mechanism that locks the lateral position of the resilient arms 266 and 268 and prevents the accidental release or loosening of the securing member 236-1 (by, e.g., an infant or baby).

Referring to FIGS. 11D-11E, according to some embodiments, the clamp body 260 includes a resilient element (e.g., compressive element or spring), which may apply a lateral force against the pair of resilient arms 266 and 268 to push them apart, when in a compressed state. Each of the resilient arms 266 and 268 includes a first stopper 267a/269a that extends inward toward the locking mechanism 274. The locking mechanism 274 includes a stopper bar 276 that can be rotated by the rotating action of the knob 278. When in a locked state, the stopper bar 276 may extend in the extension direction of the first stoppers 267a and 269a and prevent inward movement of the pair of resilient arms 266 and 268 beyond a first set point. When in an unlocked state, the stopper bar 276 may be at an angle relative to (e.g., orthogonal to) the extension direction of the first stoppers 267a and 269a and allow inward movement of the pair of resilient arms 266 and 268 beyond the first set point. In some embodiments, each of the resilient arms 266 and 268 includes a second stopper (e.g., a max stopper) 267/269b that extends inward and limits the maximum inward travel distance of the corresponding resilient arm 266/268.

Referring to FIGS. 11A and 11F, in some embodiments, the overhanging telescopic hook 264 includes two pieces each having one or more holes 280 that can be locked together using a pin 282. The combination of the holes 280 and pin 282 also allow the overhanging telescopic hook 264 to have telescopic adjustability (e.g., to have an adjustable length).

Figure 12A:
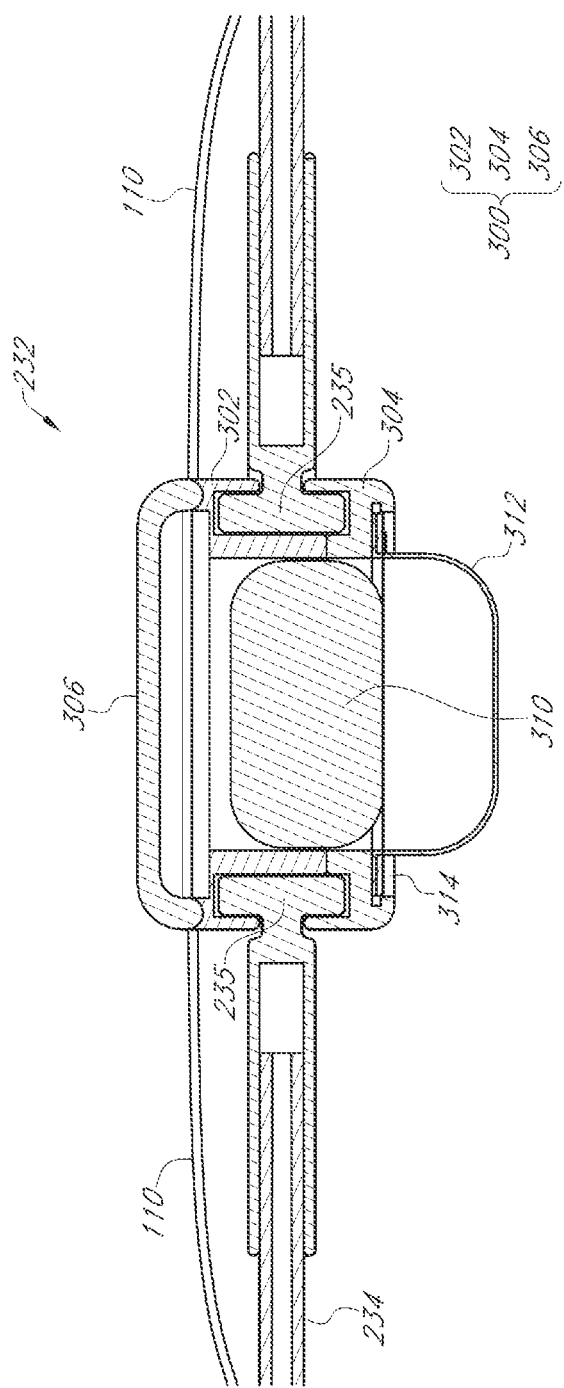
FIG. 12A illustrates a cross-sectional view of the internal structure of the central hub, according to some embodiments of the present invention.
Figure 12B:
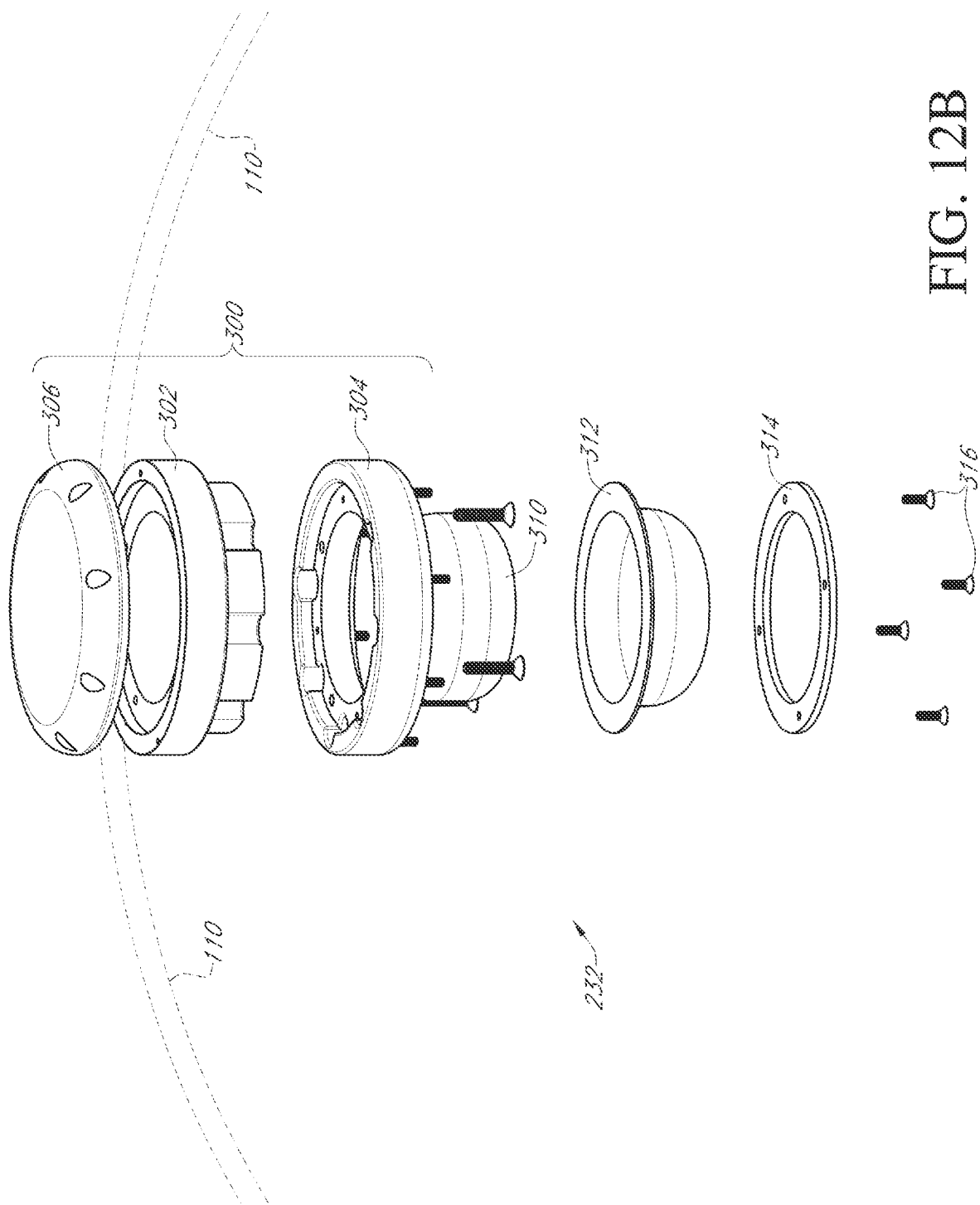
FIG. 12B illustrates an exploded perspective view of the central hub of FIG. 12A.

FIG. 12A illustrates a cross-sectional view of the internal structure of the central body 232, according to some embodiments of the present invention. FIG. 12B illustrates an exploded perspective view of the central body 232 of FIG. 12A.

Referring to FIGS. 12A-12B, in some embodiments, the central body 232 includes a housing 300 and a sensing device (e.g., a camera) 310 secured to (e.g., partially within) the housing 300 and configured to monitor the interior of the canopy 250 (e.g., monitor an individual within the canopy 250). The housing 300 includes a first portion 302, a second portion 304 configured to accommodate (e.g., mate with) the first portion 302, and a cap 306 positioned above the first and second portions 302 and 304. In some embodiments, the first and second portions 302 and 304 define therein a plurality of cavities that are configured to accommodate the ends 235 of the plurality of support members 234 and to, thereby, couple the plurality of support members 234 to the central body 232. The ends 235 of each of the support members 234 may be a ball bearing joint that allow for adjustability and movement of the support member 234 in any direction.

An optical dome 312, which may act as transparent bottom cover for the housing 300, may be affixed to the housing 300 via a ring 314 and a plurality of fasteners (e.g., screws) 316. The optical dome 312 may secure the sensing device 310 within the housing while exposing (e.g., visibly exposing) the interior of the canopy 250 for monitoring by the sensing device 310. In some embodiments, the central body 232 partially penetrates the canopy 250 through an opening in the conductive mesh 110. The central body 232 may be coupled to the conductive mesh 110 by sandwiching portions of the conductive mesh 110 that are near the opening between the cap 306 and the first portion 302. Thus, while the first and second portions 302 and 304 may be positioned within the canopy 250, when assembled, the cap may reside outside of the canopy 250. In some embodiments, portions of the housing 300 that are exposed to the interior of canopy 250 may be coated with a conductive layer in order to improve the shielding effect of the canopy 250, and to reduce or minimize the penetration of radiations from the sensing device 310 within the interior of the canopy 250. In some examples, the cap 306, which resides outside of the canopy 250, does not include any conductive material in order to facilitate the wireless transmission of data to and from the sensing device 310.

According to some embodiments, the sensing device 310 includes a camera, a microphone and speaker for providing audio in/out capabilities, and/or a carbon monoxide detector. The camera may be battery powered and may have night vision capabilities up to about 5 feet. The sensing device 310 includes a wireless transceiver for enabling wireless communication with a remote device (e.g., a mobile handheld device) external to the protective housing. The sensing device 310 may be wirelessly connected to an app available on the remote device (e.g., a smartphone or tablet). The video from the camera may be transmitted (e.g., instantly streamed) to the remote device for display to a user, and the sensing device 310 may be remotely controlled via the app. The audio capabilities may include playing a number of pre-programmed audio files, such as white noise and calming nature sounds, which can also be remotely controlled via the app. In some embodiments, the sensing device 310 includes a monitoring sensor configured to indicate to the user, via the app, when the canopy has been sufficiently closed and the desired EMF cancelation has been achieved.

Figure 13:
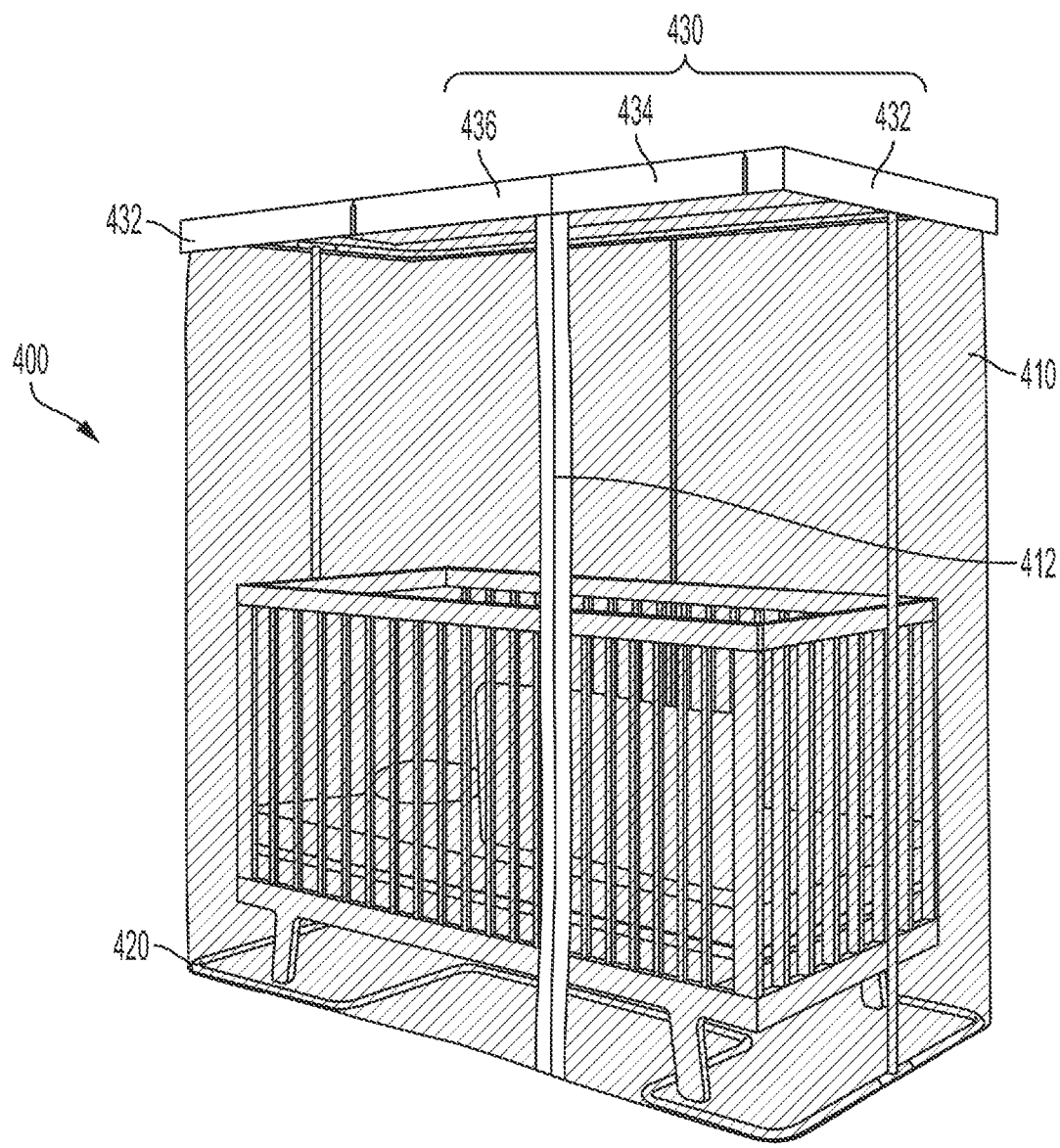
FIG. 13 illustrates a perspective view of a protective housing for shielding against electro-magnetic field (EMF) radiation, according to some exemplary embodiments of the present invention.

FIG. 13 illustrates a perspective view of a protective housing 400 for shielding against electro-magnetic field (EMF) radiation, according to some exemplary embodiments of the present invention.

In some embodiments, the protective housing 400 is a self-supporting structure that can shield an object (e.g., a crib) 10 against EMF radiation. The protective housing 400 includes a conductive mesh 410, a frame 420 coupled to the conductive mesh 410 and configured to define a shape of the conductive mesh 410, a frame cover (e.g., a crown molding) 430 coupled to the frame 420 and conductive mesh 410. The conductive mesh 410 may be the same as or substantially the same as the conductive mesh 110; as such, a full description of conductive mesh 410 will not be repeated here.

According to some embodiments, the frame cover 430 includes a main body 432 that is coupled to the frame 420, a first swivel portion 434 that is rotatably coupled to a first end of the main body 432, and a second swivel portion 436 rotatably coupled to a second end of the main body 432. The first and second swivel portions 434 and 436 corresponding to the entry (e.g., door) of the protective housing 400.

Here, the conductive mesh 410 has a slit 412 formed by a first edge and a second edge of the conductive mesh 410. The slit 412 providing the entry to the interior space of the protective housing 400 when the first and second swivel portions 434 and 436 are opened.

Figure 14:
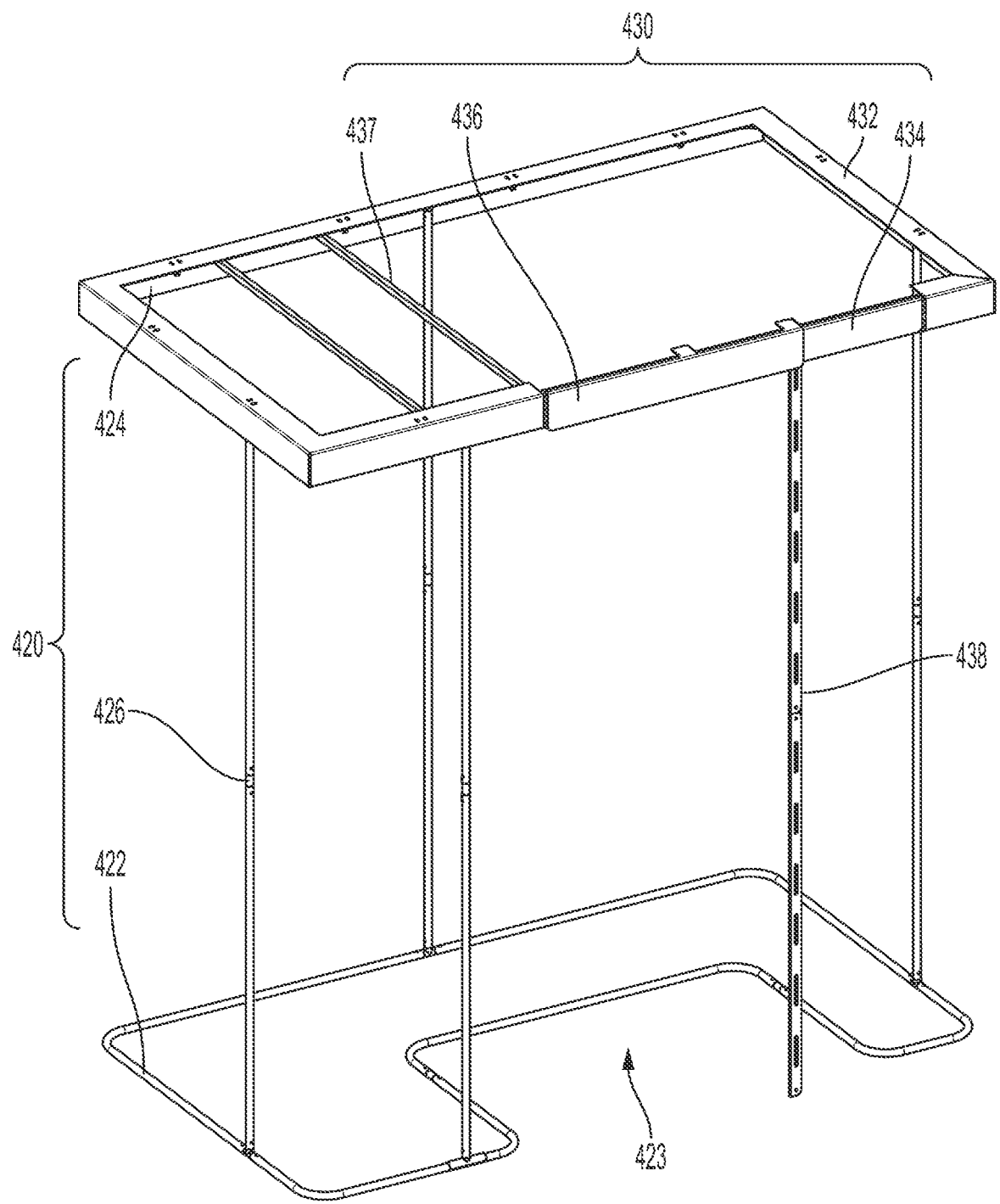
FIG. 14 illustrates a perspective view of a frame and a frame cover of the protective housing, according to some exemplary embodiments of the present invention.
Figure 15:
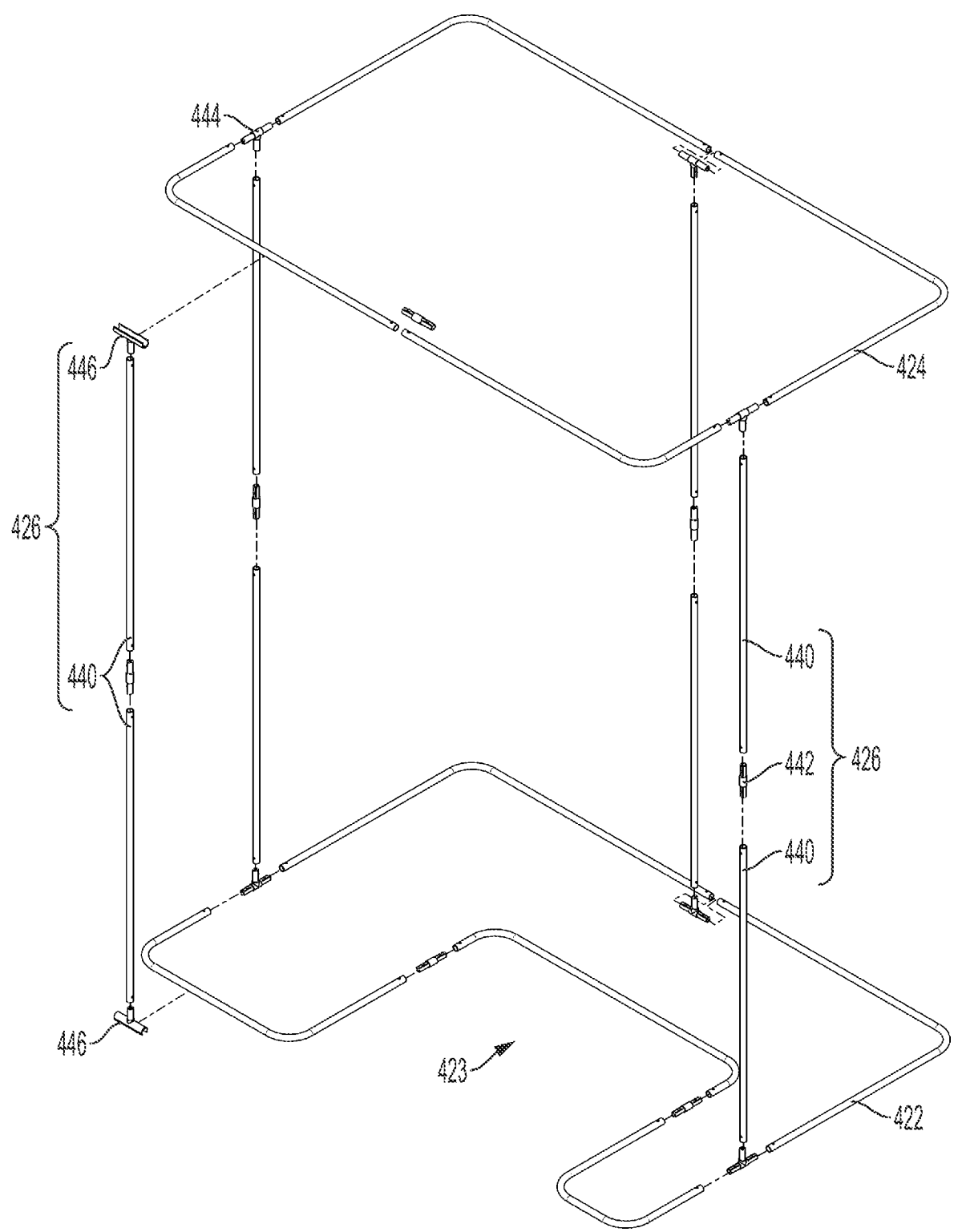
FIG. 15 illustrates a perspective view of the standalone frame of the protective housing, according to some exemplary embodiments of the present invention.

FIG. 14 illustrates a perspective view of the frame 420 and frame cover 430 of the protective housing 400, according to some exemplary embodiments of the present invention. FIG. 15 illustrates a perspective view of the standalone frame 420 of the protective housing 400, according to some exemplary embodiments of the present invention.

Referring to FIGS. 14-15, the frame 420 includes a base frame portion 422, which acts as the base for the protective housing 400; a suspended frame portion 424 configured to support the conductive mesh 410 and to allow the conductive mesh 410 to drape over the suspended frame portion 424, and a plurality of support members (e.g., vertical posts) 426 configured to support the suspended frame portion 424 above the base frame portion 422.

Each of the base frame portion 422, the suspended frame portion 424, and the frame cover 430 may have a generally rectangular shape; however, the base frame portion 422 may have an indented portion 423 (e.g., an inwardly bent portion) corresponding to the entry of the protective housing 400, which allows a user to step into the interior space without bumping into or tripping over the base frame portion 422. The base frame portion 422 may be designed to prevent tipping and improve stability of the protective housing 400.

Referring to FIG. 15, the base frame portion 422 and the suspended frame portion 424 are held together via three support members 426 connecting together the back side and the opposing sides of the frame 420. In some embodiments, frame includes an additional supporting member 426 for coupling together the front sides of the base frame portion 422 and the suspended frame portion 424, which lends additional structural support to the frame 420.

In some embodiments, the frame 420 includes a plurality of bent and straight tube portions coupled together by a number of straight clip-in couplings 442, T clip-in couplings 444, and clamp-on couplings 446. The tube portions may be made of aluminum tubing, which provides a strong yet light structural frame for the protective housing 400. However, embodiments of the present disclosure are not limited to the use of aluminum tubing, and tubings having any suitable material may be utilized as part of the frame 420.

In some examples, the frame cover 430 includes one or more crossbars 437 traversing the width of the frame cover 430 and connecting together opposing sides of the main body 432. The one or more crossbars 437 serve to improve the structural integrity of the frame cover 430 by, for example, preventing bending and inner rotation of the frame cover 430 when the first and second swivel portions 434 and 436 (which form the door of the protective housing 400) are in an open state. Thus, the frame cover 430 may offer aesthetic appeal while also serving as the structural frame for the attachment of the doors of protective housing. In some embodiments, the frame cover 430 further includes a linkage 450 that is coupled to and suspended from the first swivel portion 434 (e.g., via a bolt connection/mechanism).

Figure 16A:
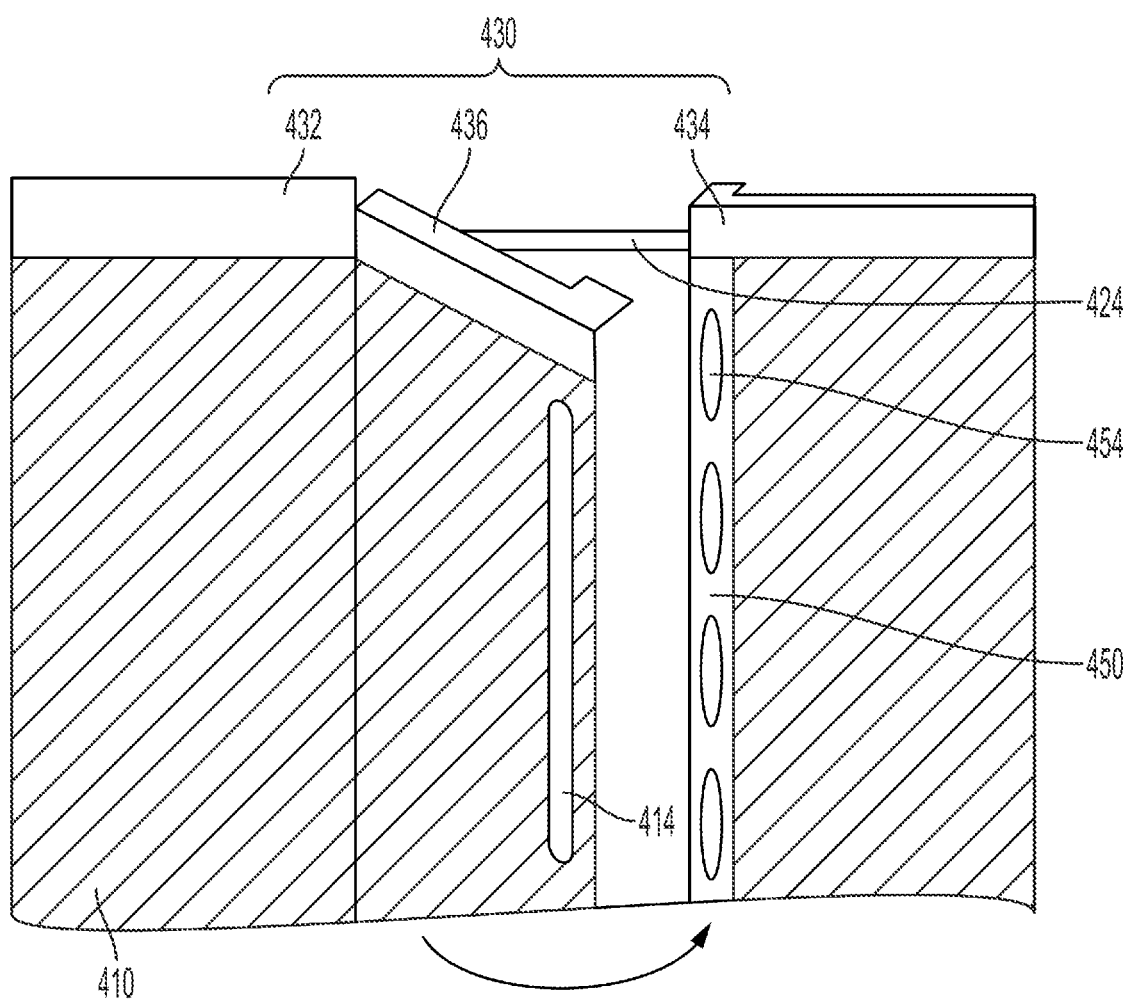
FIG. 16A illustrates first and second swivel portions of the frame cover in a partially open state, according to some exemplary embodiments of the present invention.
Figure 16D:
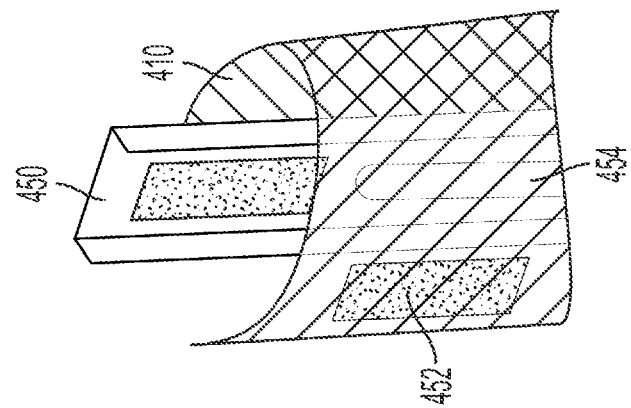
FIG. 16D illustrates a means of coupling the conductive mesh to the first swivel portion, according to some exemplary embodiments of the present invention
Figure 16C:
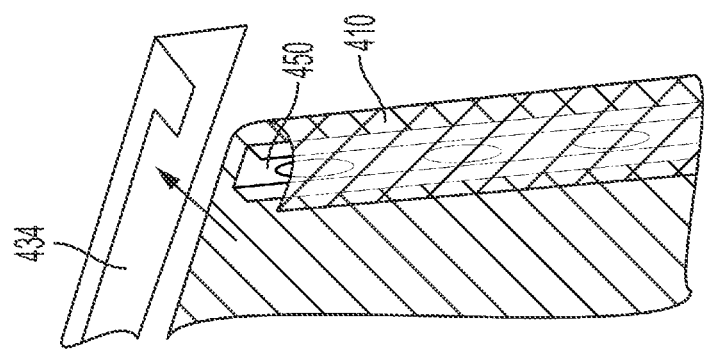
FIGS. 16B-16C illustrate the front and back side of the first swivel portion in relation to the conductive mesh of the protective housing, according to some exemplary embodiments of the present invention.
Figure 16B:
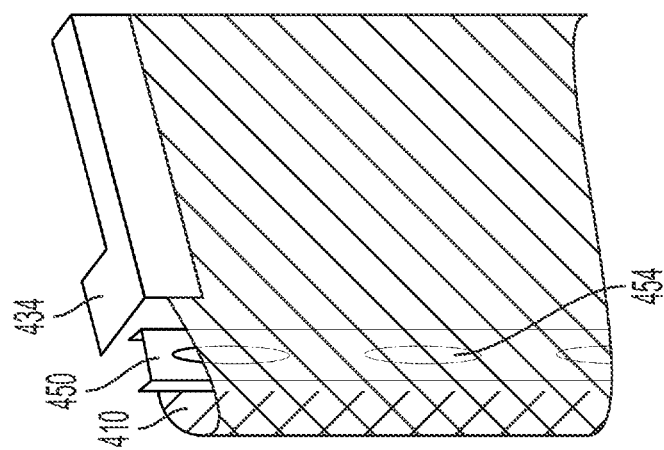
Figure 17:
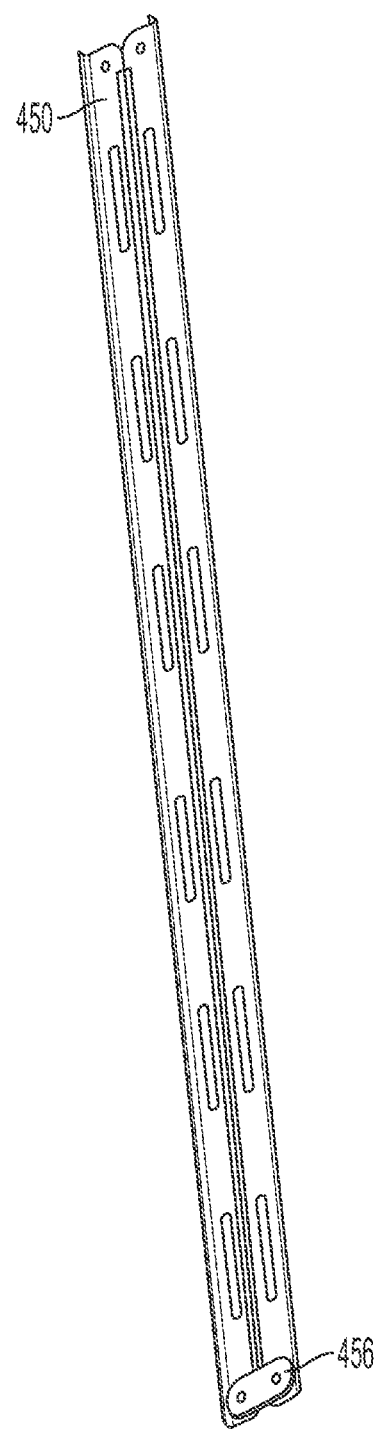
FIG. 17 illustrates the linkage in a folded state, according to some exemplary embodiments of the present invention.

FIG. 16A illustrates the first and second swivel portions 434 and 436 in a partially open state, according to some exemplary embodiments of the present invention. FIGS. 16B-16C illustrate the front and back side of the first swivel portion 434 in relation to the linkage 450 and the conductive mesh 410, according to some exemplary embodiments of the present invention. FIG. 16D illustrates a means of coupling the conductive mesh 410 to the first swivel portion 434, according to some exemplary embodiments of the present invention. FIG. 17 illustrates the linkage in a folded state, according to some exemplary embodiments of the present invention.

Referring to FIG. 16A, in some embodiments, the linkage 450 is coupled to a first edge of the slit 412 of the conductive mesh 410, and the second edge of the conductive mesh 410, which has one or more magnets (or magnetic strip) 414 affixed to it, is configured to align with and magnetically couple to the linkage 450. In other words, the linkage 450 allows for magnetically closing/sealing of the entry of the protective housing 400.

Referring to FIGS. 16B-16D, in some embodiments, the first edge of the conductive mesh 410 may wrap around the linkage 450 and be affixed to it via one or more velcro strips 452. However, embodiments of the present disclosure are not limited thereto, and the conductive mesh 410 may be affixed to the linkage in any suitable manner, for example, by adhesive, bolt mechanism, etc.

As illustrated in FIGS. 16A-16D, the linkage 450 may include a u-beam made of a light weight material, such as aluminum. To reduce the weight of the linkage 450 further and ease the load on the first swivel portion 434, the linkage 450 may have a plurality of openings (e.g., relief cuts) 454. As shown in FIG. 17, in some examples, the linkage may be foldable and include two u-beams with a rotational joint 456 attaching them, which may make it easier to package and stow away the protective housing 400.

Figure 18:
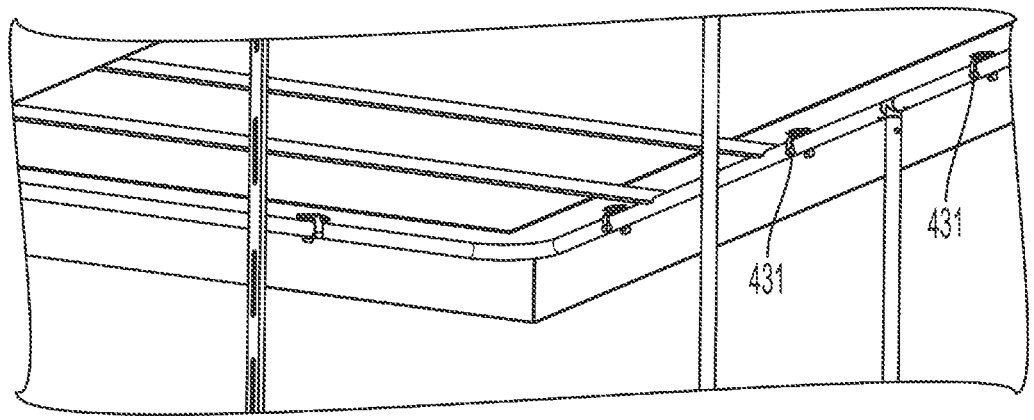
FIG. 18 illustrates a portion of the underside of the suspended frame portion and the frame cover, according to some exemplary embodiments of the present invention.

FIG. 18 illustrates a portion of the underside of the suspended frame portion 424 and the frame cover 430, according to some exemplary embodiments of the present invention.

As shown in the example of FIG. 18, the frame cover 430 may be coupled to the suspended frame portion 424 via a plurality of clips (e.g., plastic clips) 431; however, embodiments of the present disclosure are not limited thereto, and the frame 420 and frame cover 430 may be coupled to one another in any other suitable manner, such as velcro strips, and/or the like.

Figure 19B:
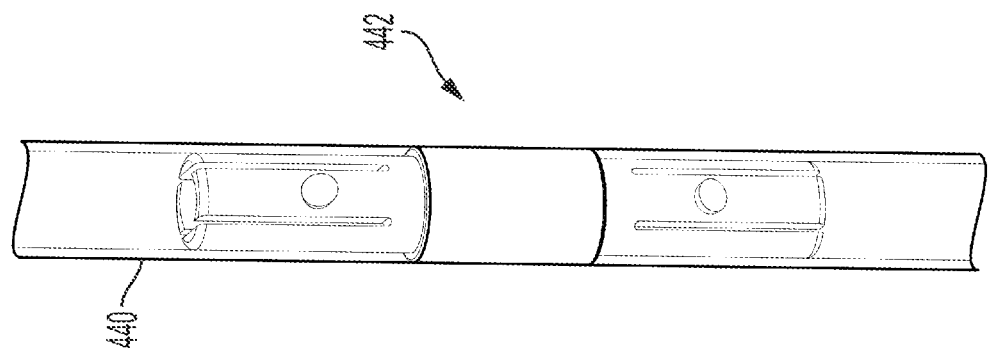
FIG. 19B illustrates the straight clip-in coupling that connects together two support arms of a support member, according to some exemplary embodiments of the present invention.
Figure 19A:
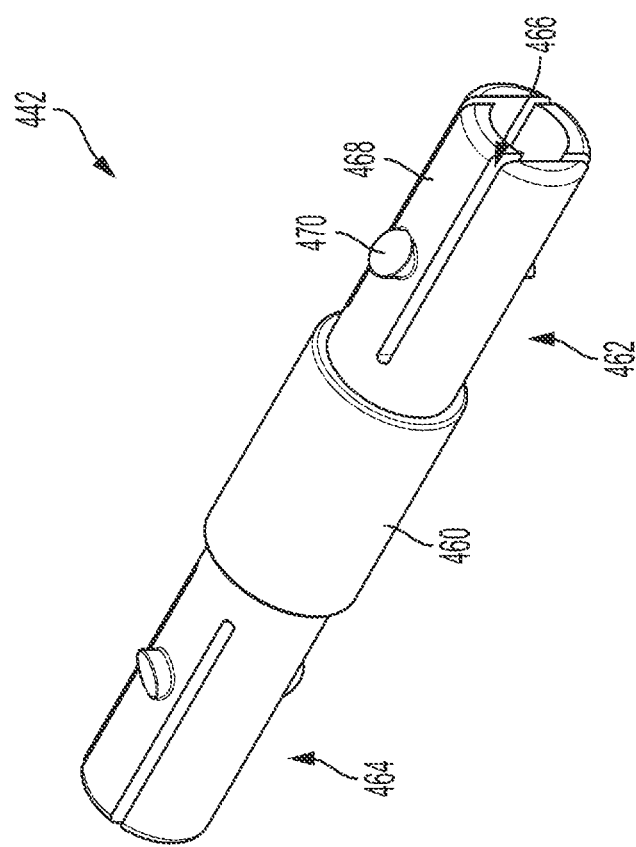
FIG. 19A illustrates the straight clip-in coupling, according to some exemplary embodiments of the present invention.

FIG. 19A illustrates the straight clip-in coupling 442, according to some exemplary embodiments of the present invention. FIG. 19B illustrates the straight clip-in coupling 442 that connects together two support arms 440 of a support member 426, according to some exemplary embodiments of the present invention.

Referring to FIGS. 19A-19B, the straight clip-in coupling 442 includes a central portion 460 and first and second coupling end portions 462 and 464 connected at each side of the central portion 460. The first and second coupling end portions 462 and 464 may be generally tubular in shape and sized to fit within end portions of support arms 440. In some embodiments, each of the coupling end portions 462 and 464 has one or more relief cuts 466 that produce a pair of beam portions 468 extending away from the central portion 460 along a lengthwise direction of the clip-in coupling 442.

Each of the beam portions 468 has a pin 470 protruding away from it, which is configured to clip into a corresponding hole in the support arm 440. The opposing pair of beam portions 468 are configured to bend and compress toward one another as the corresponding coupling end portion 462/464 is inserted into an end of the support arm 440. During insertion, once the pins 470 are aligned with the corresponding holes of the support arm 440, the elasticity of the beam portions 468 returns them to their original uncompressed position thus inserting the pins 470 in the corresponding holes and locking the straight clip-in coupling 442 into the support arm 440.

In some examples, the pins 470 may be tapered (as in FIG. 19A) to allow for easy insertion of the coupling end portions 462 and 464 into the corresponding ends of the support arms 440; however, embodiments of the present disclosure are not limited thereto, and the pins 470 may have any suitable shape and, for example, may be rounded (as in FIG. 19B).

In some embodiments, the straight clip-in coupling 442 has a single body construction (e.g., may be monolithically formed). In some examples, the straight clip-in coupling 442 may be molded or 3D printed.

FIG. 19C illustrates the T clip-in coupling 444, according to some exemplary embodiments of the present invention. FIG. 19D illustrates the T clip-in coupling 444 that connects together two support arms 440, according to some exemplary embodiments of the present invention.

Referring to FIGS. 19C-19D, the T clip-in coupling 444 includes the central portion 460 and the first and second coupling end portions 462 and 464 described above, and additionally includes a third coupling end portions 465 that is substantially the same as each of the first and second coupling end portions 462 and 464. The third coupling end portions 465 is coupled to the central portion 460 and extends in a direction crossing (e.g., orthogonal to) the extension direction of the first and second coupling end portions 462 and 464. As shown in FIG. 19D, the T clip-in coupling 444 may be coupled to three support arms 440.

While FIGS. 19A-19D illustrate the relief cuts 466 include two parallel cuts along planes that are substantially parallel to the pins 470, embodiments of the present disclosure are not limited thereto. For example, the relief cut may be a single cut along a plane that is substantially orthogonal to the extension direction of the pins 470.

Figure 20B:
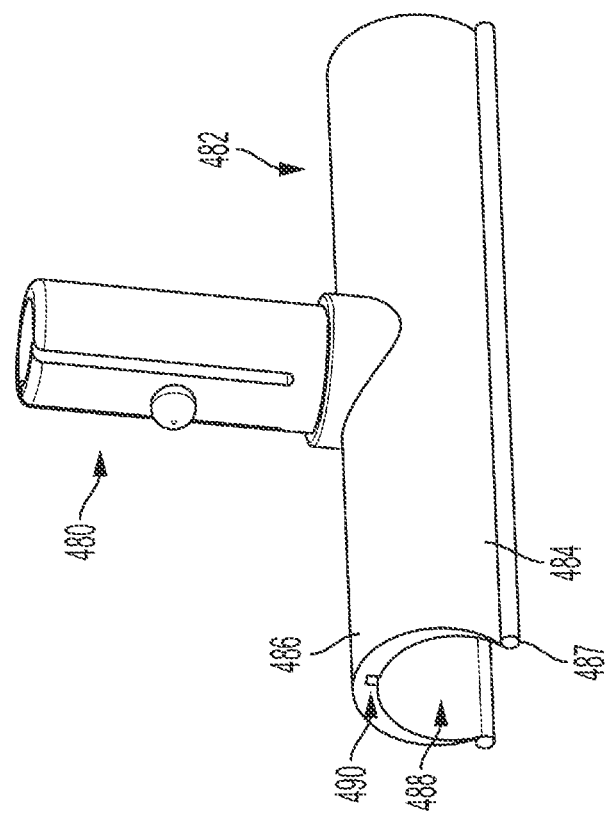
FIGS. 20A-20B illustrate the clamp-on coupling from different perspectives, according to some exemplary embodiments of the present invention.
Figure 20A:
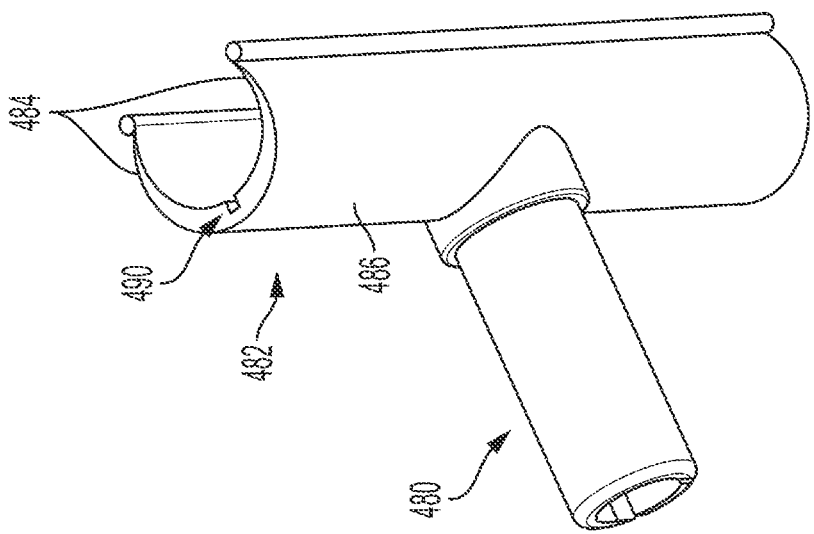
Figure 20C:
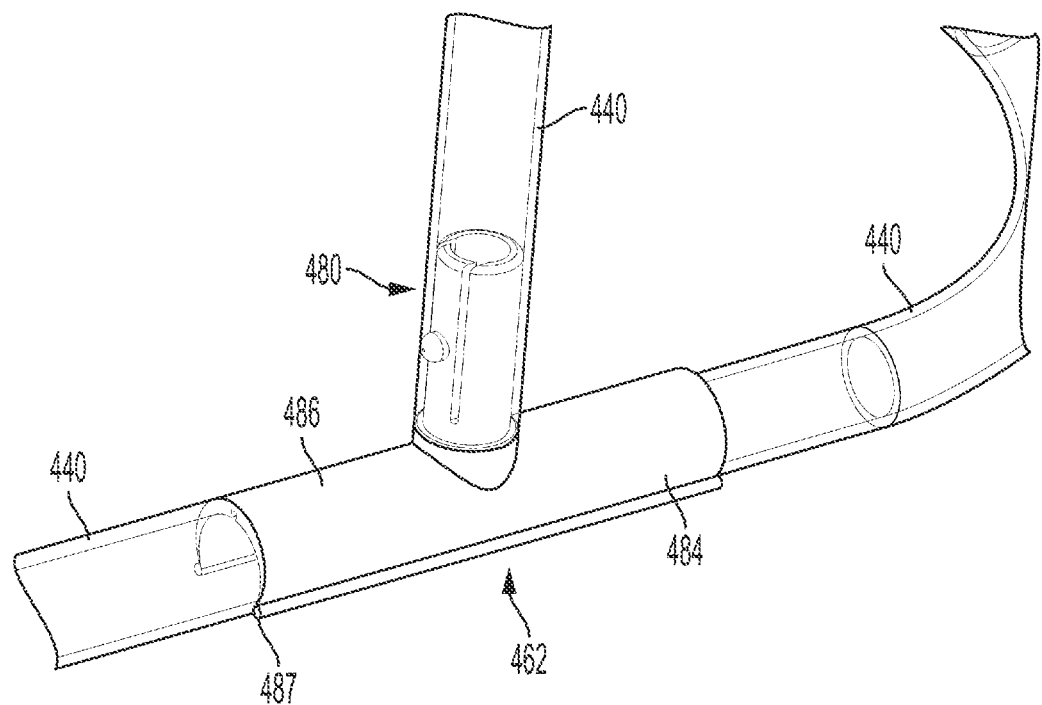
FIG. 20C illustrates the clamp-on coupling that connects together three support arms, according to some exemplary embodiments of the present invention.

FIGS. 20A-20B illustrate the clamp-on coupling 446 from different perspectives, according to some exemplary embodiments of the present invention. FIG. 20C illustrates the clamp-on coupling 446 that connects together three support arms 440, according to some exemplary embodiments of the present invention.

Referring to FIGS. 20A-20C, in some embodiments, the clamp-on coupling 446 (also referred to as a clamp member), is configured to securely couple an end of the support arm 440 to the suspended frame portion 424. The clamp-on coupling 446 includes a stem portion 480 and a sleeve 482. The stem portion 480 is configured to securely engage with (e.g., mate with/lock into) the support arm 440, and the sleeve 482 is configured to securely wrap around (or partially wrap around) a portion of the base frame portion 422/suspended frame portion 424. The stem portion 480 may be the same or substantially the same as the coupling end portion 462/464/466. As such a detailed description of the stem portion 480 will not be repeated here.

The sleeve 482 is fixedly coupled to the stem portion 480 and has two opposing arcuate lips 484 that curvedly extend from a centerline portion 486 of the sleeve 482. The opposing arcuate lips 484 define a channel (or a lateral opening) 488 therebetween extending in a direction crossing (e.g., orthogonal to) an extension direction of the stem portion 480. The arcuate lips 484 may have a semi-circular cross-sectional profile with an inner diameter that matches or substantially matches the outer diameter of the tube which it clamps onto. Upon application of an external force, the opposing arcuate lips 484 may securely wrap around and grip (e.g., tightly grip) the engaged portion of the base frame portion 422/suspended frame portion 424.

In some embodiments, the wall thickness of each of the opposing arcuate lips 484 increases from a corresponding edge 487 to the centerline portion 486 of the sleeve 482. The variation in the wall thickness of the arcuate lips 484 provides sufficient flexibility of the lips to engage a portion of the frame while also maintaining adequate clamp strength. According to some embodiments, to improve outward flexing of arcuate lips 484, the centerline portion 486 of the sleeve 482 has a notch (e.g., a relief cut) 490 extending along a lengthwise direction of the channel 488. The notch 490 may have a rectangular cross-sectional profile, as shown in FIGS. 20A-20B; however, embodiments of the present disclosure are not limited thereto, and the notch 490 may have any suitable cross-sectional profile.

Figure 21:
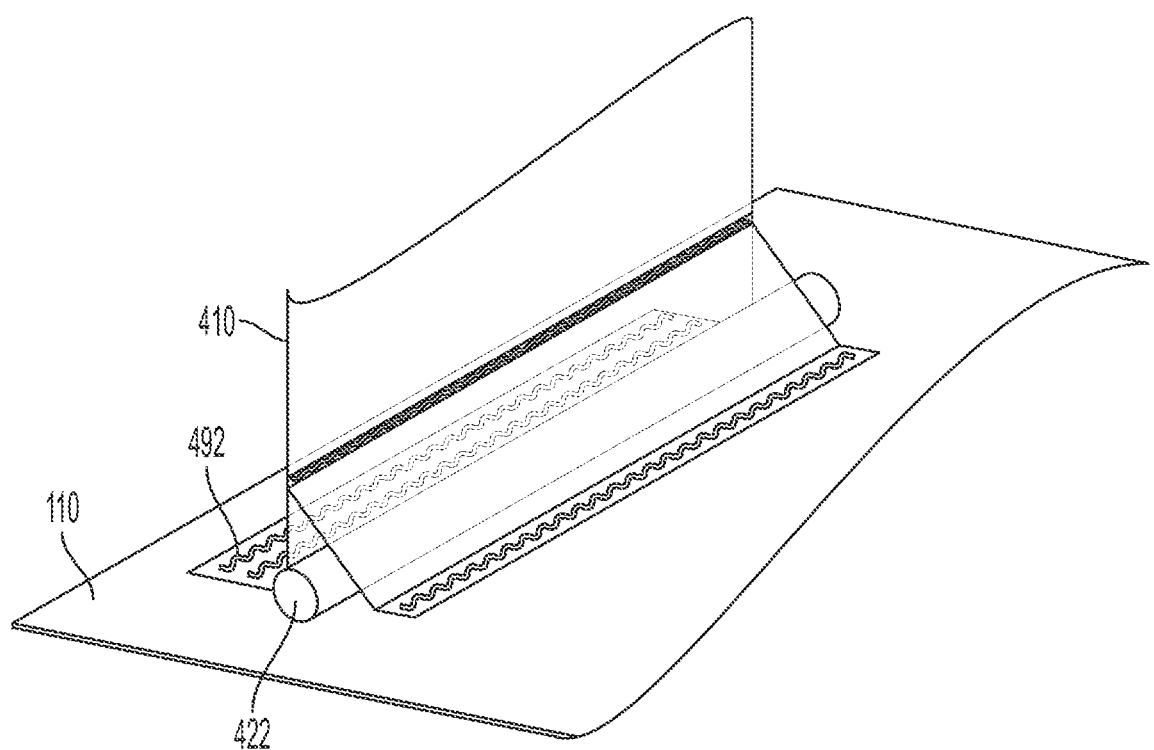
FIG. 21 illustrate the connection between the conductive mesh and the conductive plane below the base frame portion, according to some exemplary embodiments of the present invention.

FIG. 21 illustrate the connection between the conductive mesh 410 and the conductive plane 110 below the base frame portion 422, according to some exemplary embodiments of the present invention.

According to some embodiments, in order to improve the EMF shielding capabilities of the protective housing 400, the conductive mesh 410 that drapes over the frame 420 is electrically coupled (e.g., conductively coupled) to the conductive plane (e.g., the conductive matt) 110, which is positioned below the base frame portion 422. In some embodiments, the conductive mesh 410 is sown onto the conductive plane 110 via stitches 492 along its base perimeter. The sewing pattern 492 ensures that there is sufficient contact (e.g., substantial contact) between the conductive mesh 410 and the conductive plane 110.

The connection between the conductive mesh 410 and the conductive plane 110 is also important in the shipping and assembly of the protective housing 400. The connection is also designed to house the base frame portion 422 by inter-sewing the frame into an additional layer of conductive fabric.

According to some examples, the design of the protective housing 400 enables a quick assembly process. The design of the frame 420 and the method of packaging may be such that a customer may only include three supporting members 426 in the frame 420 to complete assembly. The protective housing 400 may be shipped with the base frame portion 422 and the suspended frame portion 424 completely pre-assembled and inserted into their proper connections. This ensures reduced (e.g., minimal) effort for the customer and ease of assembly.

The protective housing 400 may incorporate a top down insertion design for the customer's crib. The customer may lay the frame 420 on the ground without its supporting members 426. The customer may then place the crib at the center of the housing 400. The supporting members 426 may then be inserted lifting the sides of the housing 400 around the crib. The assembly is then completed by placing the frame cover 430 over the top of the frame 420.

While this invention has been described in detail with particular references to exemplary embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims and equivalents thereof.

It will be understood that, although the terms "first", "second", "third", etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include", "including", "comprises", and/or "comprising", when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items. Expressions such as "at least one of", when preceding a list of elements, modify the entire list of elements and do not modify the individual elements of the list. Further, the use of "may" when describing embodiments of the inventive concept refers to "one or more embodiments of the inventive concept". Also, the term "exemplary" is intended to refer to an example or illustration.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. When an element or layer is referred to as being "directly on", "directly connected to", "directly coupled to", or "immediately adjacent to" another element or layer, there are no intervening elements or layers present.

As used herein, the terms "use", "using", and "used" may be considered synonymous with the terms "utilize", "utilizing", and "utilized", respectively.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

As used herein, the term "substantially," "about," and similar terms are used as terms of approximation and not as terms of degree, and are intended to account for the inherent variations in measured or calculated values that would be recognized by those of ordinary skill in the art. Further, a specific quantity or range recited in this written description or the claims may also encompass the inherent variations in measured or calculated values that would be recognized by those of ordinary skill in the art.

The sensing device module and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the sensing device may be formed on one integrated circuit (IC) chip or on separate IC chips. Further, the various components of the sensing device may be implemented on a flexible printed circuit film, a tape carrier package (TCP), a printed circuit board (PCB), or formed on a same substrate. Further, the various components of the sensing device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

What is claimed is:

1. A protective housing for shielding against electromagnetic field (EMF) radiation, the protective housing comprising:
   a conductive mesh;
   a frame coupled to the conductive mesh and configured to define a shape of the conductive mesh; and
   a frame cover coupled to the frame and the conductive mesh, the frame cover comprising:
      a main body coupled to the frame;
      a first swivel portion rotatably coupled to a first end of the main body; and
      a second swivel portion rotatably coupled to a second end of the main body, the first and second swivel portions corresponding to an entry of the protective housing.

2. The protective housing of claim 1, wherein the conductive mesh has a slit formed by a first edge and a second edge of the conductive mesh, the slit providing the entry to an interior space of the protective housing when the first and second swivel portions are open, and
   wherein the second edge of the slit comprises a plurality of magnets positioned along the second edge.

3. The protective housing of claim 2, wherein the frame cover further comprises:
   a linkage coupled to and suspended from the first swivel portion, the linkage being fixedly coupled to the first edge of the conductive mesh, and
   wherein the second edge is configured to align with and magnetically couple to the linkage.

4. The protective housing of claim 3, wherein the linkage is foldable and comprises two u-beams coupled together via a rotational joint, and
   wherein the first edge of the conductive mesh is coupled to the two u-beams via a bolt mechanism.

5. The protective housing of claim 1, wherein the frame comprises:
   a base frame portion;
   a suspended frame portion configured to support the conductive mesh, the conductive mesh being draped over the suspended frame portion; and
   a plurality of support members configured to support the suspended frame portion above the base frame portion.

6. The protective housing of claim 5, wherein a support member of the plurality of support members comprises:
   a support arm configured to extend from the base frame portion to the suspended frame portion; and
   a first clamp member configured to securely couple a first end of the support arm to the suspended frame portion, the first clamp member comprising:
      a stem portion configured to securely engage with the support arm; and
      a sleeve fixedly coupled to the stem portion and having two opposing arcuate lips curvedly extending from a centerline portion of the sleeve, the opposing arcuate lips being configured to securely wrap around a portion of the suspended frame portion,
      wherein the opposing arcuate lips define a channel therebetween extending in a direction crossing an extension direction of the stem portion.

7. The protective housing of claim 6, wherein each of the opposing arcuate lips increases in thickness from a corresponding edge to the centerline portion of the sleeve, and wherein the centerline portion of the sleeve has a notch extending along a lengthwise direction of the channel.

8. The protective housing of claim 6, wherein the stem portion comprises:
   a pair of beam portions extending away from the sleeve along a lengthwise direction of the stem portion, and configured to mate with an end of the support arm,
   wherein each of the pair of beam portions has a pin protruding away from the corresponding beam portion and configured to clip into a corresponding hole in the support arm.

9. The protective housing of claim 6, wherein the support member of the plurality of support members further comprises:
   a second clamp member configured to securely couple a second end of the support arm to the base frame portion.

10. The protective housing of claim 5, wherein at least one of the base frame portion and the suspended frame portion comprises a clip-in coupling comprising:
    a central portion; and
    a coupling end portion coupled to the central portion and configured to be inserted into and mate with a portion of the base frame portion or the suspended frame portion.

11. The protective housing of claim 10, wherein the coupling end portion comprises:
    a pair of beam portions extending away from the central portion, each of the pair of beam portions having a pin protruding in a direction crossing a lengthwise direction of the coupling end portion, the pair of beam portions being configured to bend toward each other as the coupling end portion is inserted into the portion of the base frame portion or the suspended frame portion.

12. The protective housing of claim 5, wherein the base frame portion has an indented portion corresponding to the entry of the protective housing.

13. The protective housing of claim 5, wherein each of the suspended frame portion and the frame cover have a generally rectangular shape.

14. The protective housing of claim 5, further comprising:
    a conductive plane below the base frame portion and configured to be a grounding plane for the protective housing, the conductive plane and the conductive mesh being configured to shield an interior space, defined by the conductive plane and the conductive mesh when suspended, against EMF radiation.

15. The protective housing of claim 14, wherein the conductive mesh has a first portion and a second portion corresponding to the entry of the protective housing, and
    wherein the first portion of the conductive mesh is electrically coupled to the conductive plane.

16. The protective housing of claim 15, wherein a circumference of the first portion of the conductive mesh is physically attached to the conductive plane.

17. The protective housing of claim 1, wherein the conductive mesh is configured to shield an interior of the protective housing against EMF radiation.

18. The protective housing of claim 1, wherein the conductive mesh has a mesh size configured to permit the conductive mesh to be flexible to drape around the frame and to be breathable and see-through.

19. The protective housing of claim 1, wherein the conductive mesh comprises:
    a flexible and breathable fabric having an electrically-conductive coating, the flexible and breathable fabric comprising at least one of a polyamide, a polyester, cotton, polyethylene, and polypropylene, and the electrically-conductive coating comprises at least one of silver (Ag), gold (Au), aluminum (Al), copper (Cu), chromium (Cr), iron (Fe), manganese (Mn), tin (Sn), titanium (Ti), tungsten (W), platinum (Pt), nickel (Ni), cobalt (Co), barium (Ba), indium (In), palladium (Pd), bismuth (Bi), niobium (Nb), selenium (Se), zinc (Zn), vanadium (V), mercury (Hg), and cadmium (Cb).

* * * * *